US008830660B2

(12) United States Patent
Kuehl

(10) Patent No.: US 8,830,660 B2
(45) Date of Patent: Sep. 9, 2014

(54) MECHANICAL POWER SERVICE COMMUNICATING DEVICE AND SYSTEM

(75) Inventor: Steven J. Kuehl, Stevensville, MI (US)

(73) Assignee: Whirlpool Corporation, Benton Harbor, MI (US)

( * ) Notice: Subject to any disclaimer, the term of this patent is extended or adjusted under 35 U.S.C. 154(b) by 1205 days.

(21) Appl. No.: 12/643,297

(22) Filed: Dec. 21, 2009

(65) Prior Publication Data

US 2011/0152024 A1 Jun. 23, 2011

(51) Int. Cl.

| | |
|---|---|
| ***H05K 7/00*** | (2006.01) |
| ***G05G 7/02*** | (2006.01) |
| ***F25D 23/00*** | (2006.01) |

(52) U.S. Cl.

CPC *F25D 23/00* (2013.01); *G05G 7/02* (2013.01); *E05Y 2900/31* (2013.01)

USPC .................................... 361/679.01; 361/601

(58) Field of Classification Search

USPC ........... 361/679.01, 601; 403/119; 74/63, 416

See application file for complete search history.

(56) References Cited

U.S. PATENT DOCUMENTS

| | | | | |
|---|---|---|---|---|
| 1,958,206 | A | | 5/1934 | Rubsam |
| 3,101,984 | A | | 8/1963 | Wieckmann |
| 3,258,553 | A | | 6/1966 | Breslin |
| 3,561,506 | A | | 2/1971 | Johnson |
| 3,710,060 | A | | 1/1973 | Brevick |
| 4,068,179 | A | | 1/1978 | Sample et al. |
| 4,148,536 | A | | 4/1979 | Petropoulsos et al. |
| 4,317,969 | A | | 3/1982 | Riegler et al. |
| 4,445,743 | A | | 5/1984 | Bakker |
| 4,591,732 | A | | 5/1986 | Neuenschwander |
| 4,604,505 | A | | 8/1986 | Henninger |
| 4,663,542 | A | | 5/1987 | Buck et al. |
| 4,844,582 | A | | 7/1989 | Giannini |
| 4,964,891 | A | | 10/1990 | Schaefer |
| 5,031,258 | A | | 7/1991 | Shaw |
| 5,207,148 | A | | 5/1993 | Anderson et al. |
| 5,368,275 | A | | 11/1994 | Ketcham et al. |
| 5,385,468 | A | | 1/1995 | Verderber |
| 5,433,623 | A | | 7/1995 | Wakata et al. |
| 5,450,877 | A | | 9/1995 | Graffin |
| 5,713,752 | A | | 2/1998 | Leong et al. |
| 5,784,934 | A | * | 7/1998 | Izumisawa ..................... 74/417 |
| 5,828,341 | A | | 10/1998 | Delamater |

(Continued)

FOREIGN PATENT DOCUMENTS

| | | | |
|---|---|---|---|
| EP | 0868077 | A2 | 9/1998 |
| JP | 60033716 | A | 2/1985 |

(Continued)

*Primary Examiner* — Michael P Ferguson

(57) ABSTRACT

A mechanical power communicating device and a modular system of a host and a mechanical power communicating device for communicating a mechanical power service. A first component of the mechanical power communicating device communicates a mechanical power service from host to a second component of the mechanical power communicating device or to a functional device. The mechanical power communicating device may be a functional device, an adapter for coupling a functional device to a host, or a functional unit of an adapter and a functional device. The mechanical power communicating device may include a first component having a first interface connectable to the host, the first component pivotally connected to a second component having a second interface connectable to the functional device. The modular system may include a host having differently oriented mechanical power service interfaces and the mechanical power communicating device.

34 Claims, 16 Drawing Sheets

(56) References Cited

U.S. PATENT DOCUMENTS

| | | | | |
|---|---|---|---|---|
| 5,953,129 | A | 9/1999 | Anderlik et al. | |
| 6,176,718 | B1 | 1/2001 | Skarie et al. | |
| 6,183,264 | B1 | 2/2001 | Harsanyi | |
| 6,350,148 | B1 | 2/2002 | Bartolutti et al. | |
| 6,359,270 | B1 | 3/2002 | Bridson | |
| 6,428,334 | B1 | 8/2002 | Skarie et al. | |
| 6,445,580 | B1 | 9/2002 | Cohen et al. | |
| 6,534,951 | B2 | 3/2003 | Kawashima | |
| 6,559,882 | B1 | 5/2003 | Kerchner | |
| 6,633,157 | B1 | 10/2003 | Yamaki et al. | |
| 6,685,491 | B2 | 2/2004 | Gergek | |
| 6,921,113 | B1 | 7/2005 | Vlasblom | |
| 6,927,871 | B1 * | 8/2005 | Silverbrook et al. | 358/1.15 |
| 6,969,928 | B2 | 11/2005 | Hanson | |
| 6,973,936 | B2 | 12/2005 | Watson | |
| 6,981,695 | B1 | 1/2006 | Hedlund et al. | |
| 6,986,263 | B2 | 1/2006 | Crisp, III | |
| 7,024,717 | B2 | 4/2006 | Hilscher et al. | |
| 7,201,005 | B2 | 4/2007 | Voglewede et al. | |
| 7,207,080 | B2 | 4/2007 | Hilscher et al. | |
| 7,207,233 | B2 * | 4/2007 | Wadge | 74/412 R |
| 7,209,038 | B1 | 4/2007 | Deconinck et al. | |
| 7,264,026 | B2 | 9/2007 | Gruber et al. | |
| 7,291,032 | B1 | 11/2007 | Carver et al. | |
| 7,354,292 | B1 | 4/2008 | Lloyd et al. | |
| 7,404,298 | B2 | 7/2008 | Kim et al. | |
| 7,430,111 | B2 * | 9/2008 | Lee et al. | 361/679.27 |
| 7,493,926 | B2 | 2/2009 | Weglin | |
| 7,584,030 | B1 | 9/2009 | Graham | |
| 7,618,295 | B2 | 11/2009 | McCoy | |
| 7,625,246 | B2 | 12/2009 | McCoy et al. | |
| 7,639,485 | B2 | 12/2009 | McCoy | |
| 7,651,368 | B2 | 1/2010 | Kendall et al. | |
| 7,686,127 | B2 | 3/2010 | LeClear et al. | |
| 7,689,476 | B2 | 3/2010 | Crisp, III | |
| 7,713,090 | B2 | 5/2010 | Kendall et al. | |
| 7,740,505 | B2 | 6/2010 | McCoy | |
| 7,740,506 | B2 | 6/2010 | McCoy | |
| 7,748,494 | B2 | 7/2010 | Leclear et al. | |
| 7,751,184 | B2 | 7/2010 | McCoy | |
| 7,765,332 | B2 | 7/2010 | McCoy et al. | |
| 7,798,865 | B2 | 9/2010 | McCoy et al. | |
| 7,810,343 | B2 | 10/2010 | McCoy et al. | |
| 7,814,944 | B2 | 10/2010 | Weglin | |
| 7,826,203 | B2 | 11/2010 | McCoy | |
| 7,841,907 | B2 | 11/2010 | McCoy | |
| 7,843,697 | B2 | 11/2010 | McCoy et al. | |
| 7,852,619 | B2 | 12/2010 | McCoy | |
| 7,865,639 | B2 | 1/2011 | McCoy et al. | |
| 7,869,201 | B2 | 1/2011 | McCoy et al. | |
| 7,870,753 | B2 | 1/2011 | Marcy, V et al. | |
| 7,871,300 | B2 | 1/2011 | McCoy et al. | |
| 7,898,812 | B2 | 3/2011 | McCoy et al. | |
| 7,903,397 | B2 | 3/2011 | McCoy | |
| 7,916,336 | B2 | 3/2011 | Silverbrook et al. | |
| 7,931,114 | B2 | 4/2011 | LeClear et al. | |
| 7,934,958 | B2 | 5/2011 | Kendall et al. | |
| 7,980,088 | B2 | 7/2011 | LeClear et al. | |
| 8,008,586 | B2 | 8/2011 | Kuehl et al. | |
| 8,035,958 | B2 | 10/2011 | Kendall et al. | |
| 8,040,666 | B2 | 10/2011 | McCoy et al. | |
| 8,151,016 | B2 | 4/2012 | McCoy | |
| 8,212,430 | B2 * | 7/2012 | McCoy | 361/679.01 |
| 8,314,678 | B2 | 11/2012 | Ebrom et al. | |
| 8,342,480 | B2 | 1/2013 | Hendrickson et al. | |
| 2001/0017134 | A1 | 8/2001 | Bahr | |
| 2002/0022991 | A1 | 2/2002 | Sharood et al. | |
| 2003/0037447 | A1 | 2/2003 | Gruber et al. | |
| 2003/0154338 | A1 | 8/2003 | Boz et al. | |
| 2003/0221616 | A1 | 12/2003 | Carpenter et al. | |
| 2004/0036273 | A1 | 2/2004 | McClary | |
| 2004/0154318 | A1 | 8/2004 | Roh et al. | |
| 2004/0202421 | A1 | 10/2004 | Iiduka et al. | |
| 2005/0011205 | A1 | 1/2005 | Holmes et al. | |
| 2006/0021659 | A1 | 2/2006 | Andersson | |
| 2006/0053655 | A1 | 3/2006 | Weglin | |
| 2006/0118694 | A1 | 6/2006 | Lee et al. | |
| 2006/0125360 | A1 | 6/2006 | Kim et al. | |
| 2006/0145576 | A1 * | 7/2006 | Lee et al. | 312/406 |
| 2006/0168236 | A1 | 7/2006 | Higuma et al. | |
| 2006/0187080 | A1 | 8/2006 | Slatter | |
| 2007/0086151 | A1 | 4/2007 | Oh et al. | |
| 2008/0065289 | A1 | 3/2008 | Bertosa et al. | |
| 2008/0122585 | A1 | 5/2008 | Castaldo et al. | |
| 2008/0125911 | A1 | 5/2008 | Ebrom et al. | |
| 2008/0158172 | A1 | 7/2008 | Hotelling et al. | |
| 2008/0164224 | A1 | 7/2008 | McCoy et al. | |
| 2008/0164225 | A1 | 7/2008 | McCoy | |
| 2008/0164226 | A1 | 7/2008 | McCoy et al. | |
| 2008/0164227 | A1 | 7/2008 | LeClear et al. | |
| 2008/0164796 | A1 | 7/2008 | McCoy et al. | |
| 2008/0165282 | A1 | 7/2008 | Marcy et al. | |
| 2008/0165474 | A1 | 7/2008 | McCoy et al. | |
| 2008/0165475 | A1 | 7/2008 | McCoy et al. | |
| 2008/0165476 | A1 | 7/2008 | McCoy et al. | |
| 2008/0165478 | A1 | 7/2008 | McCoy | |
| 2008/0165505 | A1 | 7/2008 | McCoy et al. | |
| 2008/0165509 | A1 | 7/2008 | Kendall et al. | |
| 2008/0165998 | A1 | 7/2008 | LeClear et al. | |
| 2008/0166895 | A1 | 7/2008 | McCoy et al. | |
| 2008/0166915 | A1 | 7/2008 | Kendall et al. | |
| 2008/0168205 | A1 | 7/2008 | McCoy et al. | |
| 2008/0192411 | A1 | 8/2008 | McCoy | |
| 2008/0201032 | A1 | 8/2008 | Fayyad et al. | |
| 2008/0222327 | A1 | 9/2008 | McCoy et al. | |
| 2008/0231464 | A1 | 9/2008 | Lewis et al. | |
| 2008/0231764 | A1 | 9/2008 | Kendall et al. | |
| 2008/0232053 | A1 | 9/2008 | Kendall et al. | |
| 2008/0247141 | A1 | 10/2008 | Kendall et al. | |
| 2008/0265191 | A1 | 10/2008 | Walborn | |
| 2008/0287009 | A1 | 11/2008 | McCoy | |
| 2009/0009316 | A1 | 1/2009 | Kendall et al. | |
| 2009/0047824 | A1 | 2/2009 | Seibert et al. | |
| 2009/0050232 | A1 | 2/2009 | Guan et al. | |
| 2009/0054804 | A1 | 2/2009 | Gharib et al. | |
| 2009/0161579 | A1 | 6/2009 | Saaranen et al. | |
| 2010/0007325 | A1 | 1/2010 | Stark | |
| 2010/0024573 | A1 | 2/2010 | Daverman et al. | |
| 2010/0052866 | A1 | 3/2010 | Elferich et al. | |
| 2010/0120284 | A1 | 5/2010 | Oka et al. | |
| 2010/0182753 | A1 | 7/2010 | Kendall et al. | |
| 2010/0248546 | A1 | 9/2010 | McCoy | |
| 2010/0281261 | A1 | 11/2010 | Razzell | |
| 2011/0049308 | A1 | 3/2011 | Beaman et al. | |
| 2011/0073214 | A1 | 3/2011 | Guan et al. | |
| 2011/0146328 | A1 | 6/2011 | Hendrickson et al. | |
| 2011/0146329 | A1 | 6/2011 | Kuehl et al. | |
| 2011/0146330 | A1 | 6/2011 | Kuehl et al. | |
| 2011/0146819 | A1 | 6/2011 | Hendrickson et al. | |
| 2011/0147159 | A1 | 6/2011 | Kuehl et al. | |
| 2011/0147160 | A1 | 6/2011 | Kuehl et al. | |
| 2011/0147161 | A1 | 6/2011 | Kuehl et al. | |
| 2011/0147417 | A1 | 6/2011 | Kuehl | |
| 2011/0148216 | A1 | 6/2011 | McCoy | |
| 2011/0148223 | A1 | 6/2011 | McCoy | |
| 2011/0148649 | A1 | 6/2011 | de Cavalcanti et al. | |
| 2011/0148650 | A1 | 6/2011 | Jenkins et al. | |
| 2011/0148651 | A1 | 6/2011 | Hendrickson et al. | |
| 2011/0149485 | A1 | 6/2011 | Kuehl et al. | |
| 2011/0152024 | A1 | 6/2011 | Kuehl | |
| 2011/0153739 | A1 | 6/2011 | McCoy | |
| 2011/0153821 | A1 | 6/2011 | McCoy | |
| 2011/0153871 | A1 | 6/2011 | Ferragut, II et al. | |
| 2011/0153880 | A1 | 6/2011 | McCoy | |

FOREIGN PATENT DOCUMENTS

| | | | |
|---|---|---|---|
| JP | 06310202 | A | 11/1994 |
| JP | 06310204 | A | 11/1994 |
| JP | 06333633 | A | 12/1994 |
| JP | 2007080584 | A | 3/2007 |
| WO | 2007/015274 | A1 | 2/2007 |

* cited by examiner

MECHANICAL POWER SERVICE COMMUNICATING DEVICE AND SYSTEM

BACKGROUND

Appliances and other useful household equipment are increasingly designed to interact with one another, as well as with a variety of consumer accessory devices. A consumer accessory device may be used, for example, in conjunction with an appliance to enhance or supplement the functionality of the appliance. The accessory device may be configured to be permanently or removably connectable to the appliance. The accessory device may also be operable independently of the associated appliance, thereby requiring a connection mechanism capable of sustaining repetitive attachment cycles.

Operation of the interconnected devices may also involve the transfer of a variety of substances, such as various liquids, gases, and solids. For example, a refrigerator may provide an external water connection for connecting an accessory water dispenser. A freezer section of a refrigerator may include provisions for connecting an accessory ice maker. A washing machine may provide an option for attaching a detergent and/or softener dispenser.

BRIEF SUMMARY

A hinged mechanical power communicating device as well as a modular system of hosts and a hinged mechanical power communicating device is described. A first component of the hinged mechanical power communicating device communicates a mechanical power service to a host, to a second component of the hinged mechanical power communicating device or to a functional device. The mechanical power communicating device may be a functional device, an adapter for coupling a functional device to a host, or a functional unit of an adapter and a functional device.

According to one aspect of the invention, a mechanical power communicating device mounts a functional device to a first host mechanical power service interface communicating a mechanical power service. The mechanical power communicating device comprises a first component capable of supporting a functional device, and a second component having a second host mechanical power service interface capable of removably coupling with the first host mechanical power service interface and communicating the at least one mechanical power service with the first host mechanical power service interface, wherein the second component is pivotally connected to the first component for movement relative to the first component about a pivot axis.

According to another aspect of the invention, a system for communicating a mechanical power service comprises a host having a host mechanical power service interface capable of providing a mechanical support service and communicating a mechanical power service, the host mechanical power service interface having one of a vertical orientation and a horizontal orientation, and a mechanical power communicating device having a first component having a mechanical power service interface capable of removably coupling with the host mechanical power service interface and receiving the mechanical support service and the mechanical power service from the host mechanical power service interface, and a second component capable of supporting a functional device, the second component pivotally connected to the first component to move between at least a first position for connecting to the host mechanical power service interface having the vertical orientation, and a second position for connecting to the host mechanical power service interface having the horizontal orientation.

According to yet another aspect of the invention, an adapter mounts a functional device to a host having a host mechanical power service interface communicating at least one mechanical power service. The adapter comprises a first component capable of supporting the functional device, a second component having a mechanical power service interface capable of removably coupling with the host mechanical power service interface and communicating the at least one mechanical power service with the host mechanical power service interface, wherein the second component is pivotally connected to the first component for movement between a first orientation having a first angular relationship between the first and second components, and a second orientation having a second angular relationship between the first and second components different than the first angular relationship, and a service pathway configured to communicate the at least one mechanical power service between the first and second components in both the first and second orientation of the second component.

According to still another aspect of the invention, a mechanical power communicating device removably mounts to a host having a first service interface communicating at least one service. The mechanical power communicating device comprises a first component having a second service interface capable of removably coupling with the first service interface and communicating the at least one service with the first service interface, a mechanical power consumer, a hinge system pivotally connecting the mechanical power consumer to the first component for movement relative to the first component about a pivot axis, a service conversion device associated with the first component capable of converting service between the at least one service and a mechanical power service, and a mechanical power service communication system communicating mechanical power service between the service conversion device and the first component.

According to still another aspect of the invention, a mechanical power communicating device mounts a functional device to a host having a host service interface, and comprises a first component having a first service interface capable of removably coupling with the host service interface and communicating a first service with the host service interface and a first service conversion device converting the first service to a first mechanical power service, a second component having a second service interface capable of removably coupling with a device service interface and communicating a second service with the device service interface and a second service conversion device converting the first mechanical power service to the second service, a hinge system pivotally connecting the first component to the second component to pivotally support the second component in a plurality of relative angular orientations about a pivot axis, and a service pathway communicating the first mechanical power service between the first and second components in at least two relative angular positions of the first and second components.

DETAILED DESCRIPTION

Figure 1:
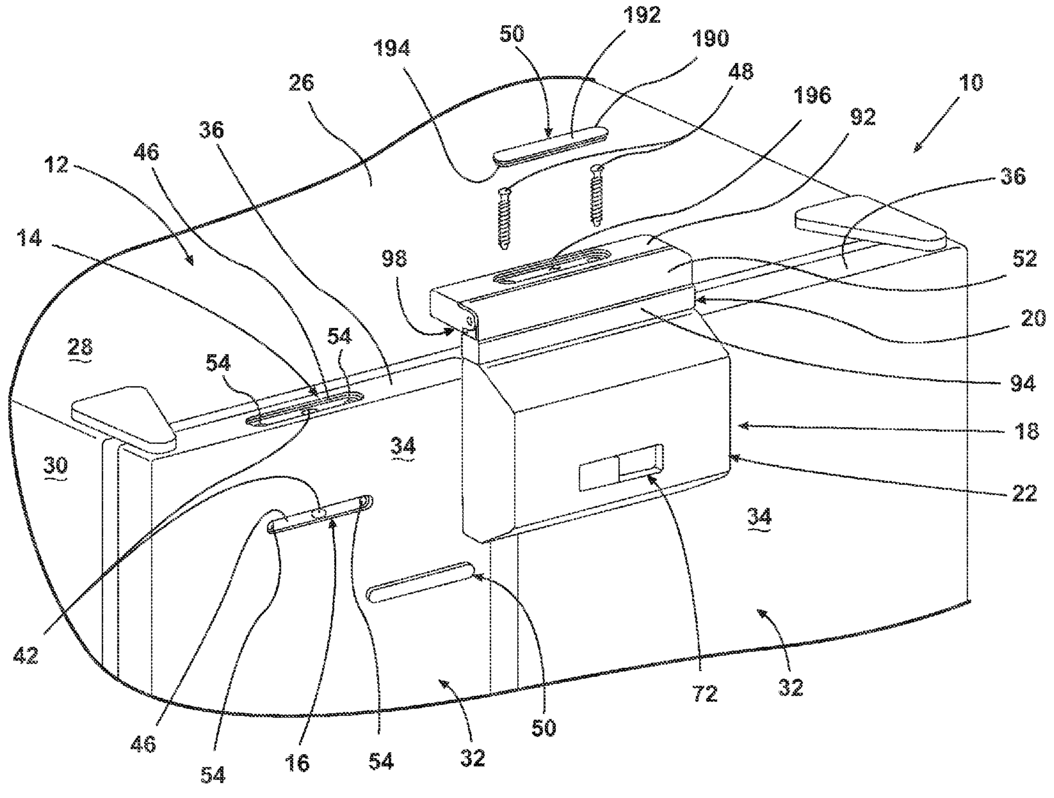
FIG. 1 is an exploded perspective view of a modular system according to a first embodiment of the invention comprising a host having alternative host service interfaces, an interface cover, and a mechanical service communicating device including a functional device and an adapter for holding the functional device.

Referring now to the discussion that follows and also to the drawings, illustrative approaches to the disclosed systems and methods are shown in detail. Although the drawings represent some possible approaches, the drawings are not necessarily to scale and certain features may be exaggerated, removed, or partially sectioned to better illustrate and explain the present invention. Further, the descriptions set forth herein are not intended to be exhaustive or to otherwise limit or restrict the claims to the precise forms and configurations shown in the drawings and disclosed in the following detailed description.

The drawings and the following detailed description relate generally to a hinged substance communicating device for coupling to a host in at least two distinct orientations. The substance communicating device may be a portable device, an adapter for coupling a portable device to a host, or a functional unit of an adapter and a portable device. The following definitions apply to terms that may be used in the specification and the claims, unless otherwise noted.

As used herein, a "service" is a useful functionality that may be communicated from one device to another device, such as electrical power, electronic data, mechanical support, mechanical power, mechanical motion, thermal energy, illumination, sound, fluid power, or a substance. A service may comprise multiple categories of service, such as electrical power and data in a single signal. A service may be provided continuously or for specified times, for specified amounts, or for the duration of certain events, such as the duration of coupling to provide timed dispensing. Alternatively, a service may be provided in quanta, such, as packets of data, doses of substances, batches of discrete items such as tablets, or consumable components.

As used herein, a "mechanical power service" is mechanical power or mechanical movement that may be communicated from one device to another. Types of mechanical power service include shaft power, in which a rotating or linearly oscillating shaft is used to communicate mechanical power or movement, and fluid power, in which pneumatics or hydraulics can be used to communicate mechanical power or movement.

The term "coupled," and any variation thereof, as used herein, includes any type of connection that permits transfer of a service, as hereinafter defined, between two devices. The term "coupled" does not require a physical connection between the two devices, so long as the coupling permits transfer of a service. The term "coupled" includes both fixed and removable coupling, as well as both continuous and intermittent coupling.

As used herein, "mechanical power communication" or a "mechanical power service communication" is a useful provision of a mechanical power service from one device to another device. Communicating a mechanical power service means supplying or receiving a mechanical power service. As used herein, communication of mechanical power service includes both uni-directional and multi-directional communication, between any two devices, either directly, or through an adapter, as defined herein. For example, a mechanical power service may be communicated through interengaging gears, wheels, plates, levers, or chains.

As used herein, the term "service conversion device" is a device capable of converting one service to another service, such as converting electrical power into mechanical power, or changing the type of or characteristics of a service, such as by amplifying an audio service, converting an AC electrical power service to a DC electrical power service, or changing the temperature of a substance provided as a service. A "mechanical power conversion device" is a device that coverts a service into a mechanical power service or vice versa. This includes the conversion of a first type of mechanical power service into another type of mechanical power service. Examples of mechanical power conversion devices include at least one of a shaft, a wheel, a gear, a pump, a turbine, a electricity generator, a piston, a steam generator, a solenoid, an electrical motor, a heater, a catalytic burner, and an internal combustion engine. A pump can convert shaft power to fluid power. A turbine can convert thermal or fluid power into shaft power. An electrical generator can convert mechanical power service into electrical service by converting shaft power into electricity. A piston can convert linearly oscillating shaft power into fluid power or a sound service. A steam generator can convert thermal energy service into fluid power by applying heat to a liquid to generate steam. A solenoid can covert electrical service to linearly oscillating shaft power. An internal combustion engine can convert thermal energy service to shaft power.

The terms "provide" and "supply" and any variation thereof are used herein to denote a source of service, such as mechanical power service, relative to a device receiving the service. Neither term is limited to the original source of the service. A device that provides or supplies the service may simply be passing on the service from the original source. For example, a device that provides mechanical power service from a rotating wheel or gear may pass on to another device power in the form of a translating belt.

The term "receive" and any variation thereof, is used herein to denote receipt of the service, such as mechanical power service, relative to the device providing the service. The term is not limited to the ultimate consumer of the service. A device that receives the service may simply be passing on the service from the source, such as a transmission, to a device that will consume, as hereinafter defined, the service. The device that receives a service is not necessarily the end consumer of the service.

The term "consume" and any variation thereof, as used herein, denotes a recipient of a service that employs, uses, stores, or dispenses at least a portion of the service in connection with performing a function, such as motor consuming electrical service in the process of creating a mechanical service or a fan consuming mechanical service in the process of creating an airflow.

A "useful device" as used herein is a device that is capable of performing a useful physical or virtual function either alone or in combination with another device.

The term "mechanical power service consumer" and any variation thereof, as used herein, is any useful device that employs, uses, stores, or dispenses a mechanical power service in connection with performing a physical or virtual function. A mechanical power service consumer may be, for example, a smart utensil, an appliance, a resource controller, a dispenser, a detergent dispenser, a drink dispenser, a mixer, a fan, a blender, a cycle accessory, an ice maker, a coffee maker, a slushy maker, a substance dispenser, or an adapter capable of passing a received mechanical power to another mechanical power consumer.

The term "mechanical power service provider" and any variation thereof, as used herein, is any device that is capable of providing or supplying a mechanical power service to another device.

A "mechanical power service communicating device" as used herein is any device that is capable of communicating a mechanical power service with another device, and may be a mechanical power service provider or mechanical power service consumer.

As used herein, the term "host" is an apparatus that has a primary function independent of providing a mechanical power service. A host may be a mechanical power service provider, a mechanical power service consumer, or both. For example, the host may be an appliance and the primary function can be performing a series of steps to conduct a useful cycle of operation. The appliance may be a conventional household appliance, such as a refrigerator performing a cooling cycle or an ice making cycle. Other examples of appliances that may be hosts include, but are not limited to, a freezer, a conventional oven, a microwave oven, a dishwashing machine, a stove, a range, an air conditioner, a dehumidifier, a clothes washing machine, a clothes dryer, a clothes refreshing machine, and a non-aqueous washing apparatus, or any combination thereof. Alternatively, the host may be a fixture such as a water softener, a water heater, a furnace, pool water treatment equipment, or an HVAC system. The host may be a small device such as a blender, a mixer, a trash compactor, a vacuum cleaner, or a robot. The host can alternatively comprise furniture, such as a desk or a sofa, a structural feature of a building, such as a wall, a cabinet, countertop, or a door, a part of a vehicle, such as a dashboard, an air craft passenger seat, a bicycle handle, and a shopping cart handle. The host may also provide other services, such as electrical power, electronic data, substance handling, illumination, heat, or sound.

As used herein, the terms "accessory" or "accessory device" refer to any useful device which may be coupled to a host and communicate a mechanical power service to or from the host. An accessory device may be used primarily in conjunction with a host to enhance or supplement the functionality of the host, and may have independent functionality and utility. An accessory device may be a mechanical power service provider, a mechanical power service consumer, or both. Examples of an accessory device include, but are not limited to, a paper product dispenser, a dry goods dispenser, a bottle opener, a liquid dispenser, and a pill dispenser. Some non-limiting examples of an accessory that can use converted mechanical power service include a coffee maker, a coffee grinder, a food mixer, a vacuum packager, a food dehydrator, a food aerator, a food steamer, and a food dispenser. A coffee maker can make use of the conversion of shaft power to electrical service, and, optionally, the conversion of electrical service to thermal energy service to heat the coffee. A coffee grinder or a food mixer can make use of the conversion of fluid power to shaft power to turn the grinding or mixing mechanism. A vacuum packager or a food dehydrator can make use of the conversion of shaft power to fluid power to operate a vacuum pump. A food dehydrator can further make use of the conversion of shaft power to electrical service to operate a heater. A food aerator can make use of the conversion of shaft power to fluid power to operate a pneumatic pump. A food steamer can make use of the conversion of shaft power to electrical service, and, optionally, the conversion of electrical service to thermal energy service to create steam from a liquid. A food dispenser can make use of the conversion of shaft power to fluid power, or vice version to operate a dispensing mechanism.

As used herein, the term "portable device" is an accessory device that is designed to be moveable by a user during its useful life between a use location and a storage location or alternative use location.

A "functional device" may be a mechanical power service provider, a mechanical power service consuming device, or both, or may be a device capable of communicating another service, such as electrical power, substance or data.

As used herein, the term "independent device" is a useful device that provides a useful function without being connected to a mechanical power service provider. In some cases, the primary function of the independent device is different from the primary function of the host from which the independent device may receive a mechanical power service. The independent device may be an accessory device.

As used herein, the term "dependent device" is a useful device that provides a useful function only when connected to a mechanical power service provider. A dependent device may be a mechanical power service consumer. Examples of a dependent device that may be coupled to a host include, but are not limited to, a smart pan or pot, an icemaker, and a bulk detergent dispenser.

A "service connector system" is a connector system having at least two separate service connector components, each associated with a useful device. The service connector components cooperate with one another to couple the useful devices to facilitate communication of a mechanical power between the useful devices. A service connector system may carry multiple services. An electromagnetic service connector system, for example, may be associated with or incorporated into a mechanical power service connector system or may be independent of a mechanical power service connector system but be associated with the same mechanical power service provider or mechanical power service consumer.

As used herein, the term "mechanical power coupling system" or a "mechanical power connector system" is a service connector system having at least two separate mechanical power service communicating connector components, each associated with a useful device. The mechanical power service communicating connector components cooperate with one another to couple the useful devices to facilitate communication of a mechanical power service between the useful devices.

As used herein, the term "plug" is a generally male mechanical power service connection component.

As used herein, the term "receptacle" is a generally female mechanical power service connection component.

As used herein, the terms "service communication line," "service line" or "service pathway" is a pathway for transferring a service from one location to another.

As used herein, the term "mechanical power service pathway" refers to a service pathway for transferring a mechanical power service from one location to another. The mechanical power service pathway may have any of a variety of configurations depending on the type of mechanical power service being transferred, including but not limited to a shaft, a cable, a chain, or a belt.

As used herein, the term "adapter" is an intermediate device that may be provided between a first and second useful device, such as between a host and an accessory, to facilitate the communication of services between the first and second useful devices. An adapter may receive a service from the first useful device and provide the service or a modified version of the service to the second useful device, for example, by modifying the rotational speed at which mechanical power is delivered or by changing rotational motion into translational motion, for example. In some applications, multiple adapters may be interposed between two useful devices. In other applications, three or more useful devices may be coupled to a single adapter, such as multiple accessories for a host. In some applications, the adapter may itself be a useful device providing a useful function not provided by the other useful device or devices coupled to it. An adapter may optionally include a transformative component that transforms a service from a service provider to a different service, which is supplied to a service consumer. This may be useful when the service from the service provider is not compatible with the service consumer. The transformative component can be configured to transform the service into a compatible form for the service consumer. Examples of transformative components are protocol converters, power transformers, or other devices that convert substance, energy, or data from a first form to a second form.

As used herein, the term "functional unit" is the combination of any adapter coupled to an accessory, which together provide a functionality that neither the adapter nor the accessory can alone provide. Any functional unit itself is also included within the meaning of the term "accessory device".

As used herein, the term "substance," and any variation thereof, is a material that may be communicated from one device to another. A substance may include a gas, a liquid, or a solid, or any combination thereof. Examples of substances include, but are not limited to, liquid soap, powdered soap, compressed air, tablets, caplets, water, ice cubes, a beverage, as well as others. A substance may be consumable.

The term "consumable" and any variation thereof, as used herein, includes any substance that may be consumed by a host, an accessory device, or a user person, such as food, cosmetics, or medicine. The consumable may, for example, be a substance that is used up and must be replenished for subsequent cycles of operation. For a clothes washer, a consumable might be a detergent and/or a softener. For a clothes dryer, a consumable might be an anti-static cloth. For a cooking or refrigeration appliance, the consumable may actually be the article on which the appliance performs its cycle of operation, as in the case of food, later to be consumed by a person. More specific examples of the use of a consumable in appliances include dispensing additives for clothes washers, clothes dryers, or combination washer/dryer appliances. The additives may include, but are not limited to, normal detergents, gentle detergents, dark clothing detergents, cold water detergents, fabric softeners, chlorine bleaches, color-safe bleaches, and fabric enhancement chemistry. Non-limiting examples of fabric enhancers are additives to provide stain resistance, wrinkle resistance, water repellency, insect repellency, color fastness, fragrances, and anti-microbials. Another example of a consumable is the filters used by an appliance. Refrigerators, dryers, washers, and dishwashers are all known to use filters that are consumed in the sense that they wear out and must be replaced.

A mechanical service power communicating device and a modular system having such a mechanical service power communicating device are illustrated and described in detail herein. The mechanical power service communicating device may be one or more of a mechanical power service consumer, a mechanical power service provider, a functional device, or an adapter. The mechanical power service communicating device enables mounting to differently oriented mechanical power service interfaces. For example, a first host, like a refrigerator, might have an upwardly oriented mechanical power service interface and a second host, like a wall, might have an outwardly oriented mechanical power service interface. The mechanical service power communicating device can have two pivotable components so as be capable of communicating mechanical power between the two components in different orientations.

If the mechanical service power communicating device is an adapter, the adapter has a first component capable of coupling to a host having a first host service interface and communicating a first service with the host, as well as a second component capable of coupling to a functional device having a first device service interface and communicating a second service with the functional device. The adapter communicates a mechanical power service between the first and second components. Where the first and second services are not mechanical power services, or are different from the mechanical power service communicated between the first and second components, the first and second components may include service conversion devices to convert one type of service to another type of service. The modular system may include a one or more hosts having differently oriented mechanical power service interfaces and a hinged mechanical power service communicating device.

Referring now to the drawings, and more particularly to FIG. 1, a modular system 10 according to a first embodiment of the invention comprises a host 12 having at least one host service interface for communicating one or more services, such as mechanical power, electrical power, data, or a substance service. As illustrated, the host 12 has two host service interfaces 14, 16. Modular system 10 further has at least one mechanical power service communicating device 18. In the embodiment illustrated, mechanical power service communicating device 18 is comprised of two units, a hinged adapter 20 and a functional device 22, described later in detail, either of which may alone be considered a mechanical power service communicating device. The mechanical power service communicating device 18 can be connected directly or indirectly the either host service interface 14, 16. In the modular system 10 illustrated, the adapter 20 is coupled directly to the host service interface 14 and the functional device 22 is coupled indirectly to host 12 by being coupled to the adapter 20.

Figure 4:
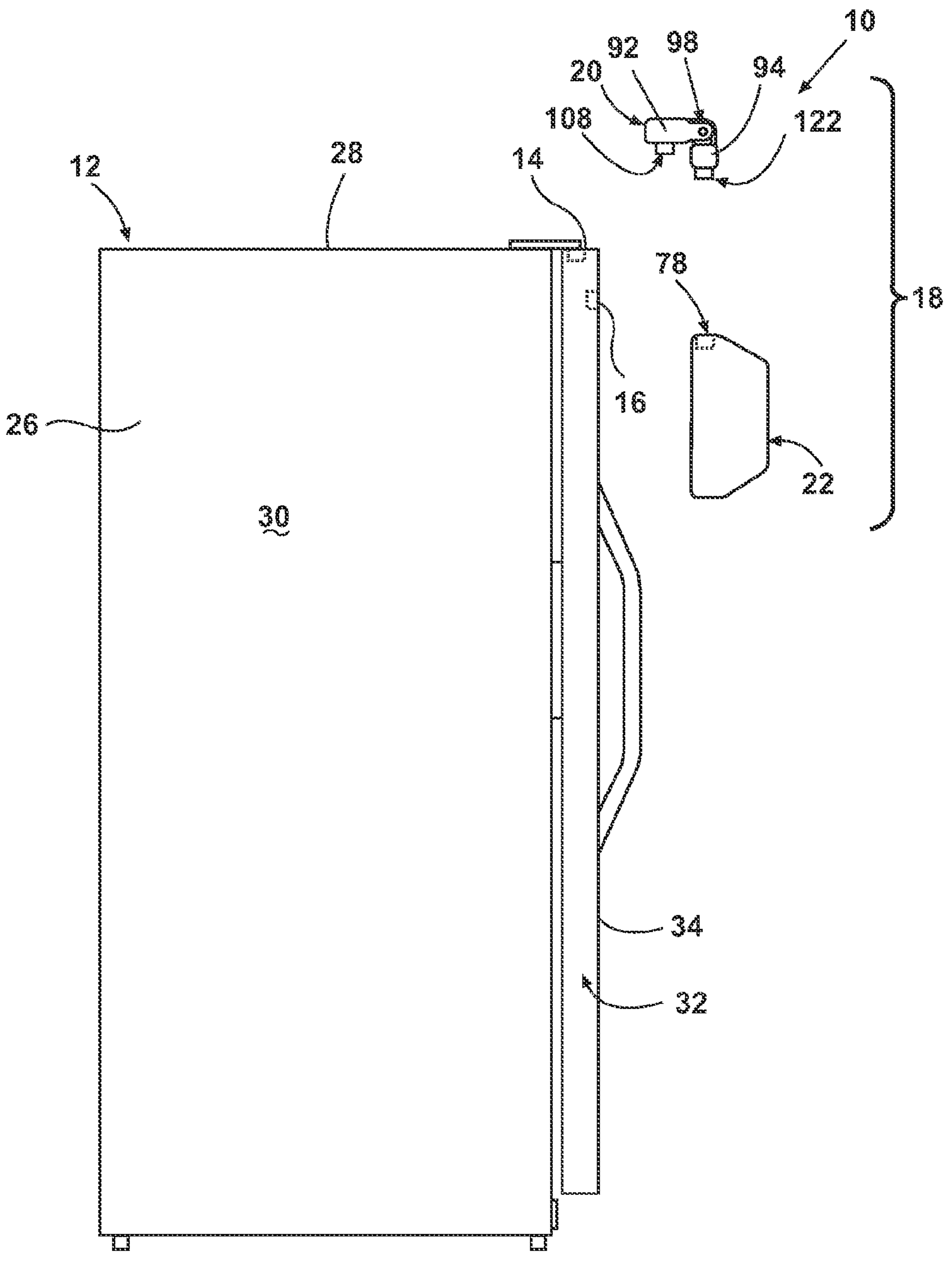
FIG. 4 is an exploded side view of the modular system of FIG. 1.

Referring to FIGS. 1 and 4, host 12 is a structure capable of providing a mechanical support service. As illustrated, the host 12 is an appliance such as a refrigerator. Host 12 provides a mechanical support service to the adapter 20 via either host service interface 14 or 16, and the adapter 20 may in turn provide mechanical support service to the functional device 22.

Mechanical support service is the physical coupling of two objects, such as between any combination of the host 12, the adapter 20, and the functional device 22. The mechanical support service may include direct or indirect physical mounting, unless expressly stated otherwise. Physical coupling includes a fixed or removable mounting, unless expressly stated otherwise. As an example, two possible categories of mechanical support services are hanging the functional device 22 as opposed to docking the functional device 22.

Host 12 includes a cabinet 26 with various surfaces and features, such as a horizontal top surface 28 and vertical side surface 30 and internal surfaces within the cabinet, not shown. Host 12 further may include a pair of doors 32 hingedly connected to the cabinet 26, each door 32 having various surfaces and features, such a vertical front face 34 and a horizontal top edge 36.

It will be appreciated that the host 12 may be a service provider and that both the functional device 22 and the adapter 20 may be service consumers. Alternatively, functional device 22 may be a service provider and adapter 20 and host 12 may be service consumers. While the embodiment illustrated in FIG. 1 provides for the functional device 22 to be removable from the adapter 20, it is also contemplated that the functional device 22 may be incorporated into the adapter 20.

Host service interfaces 14, 16 may be integrally formed with the host 12 or may be add-on devices which are removable or non-removable from the host 12. Each host service interface 14, 16 is provided on one of the surfaces or features of the host 12. As depicted in FIG. 1, host service interface 14 is provided on the horizontal top edge 36 of one of the doors 32, and host service interface 16 is provided on the vertical front face 34 of one of doors 32. Alternatively, one of the host service interfaces 14, 16 may be provided elsewhere, such as on the top surface 28 or the side surface 30 of the cabinet 26, or at the control panel of an ice and water dispenser (not shown) or on an inner surface or feature of cabinet 26. Host 12 may further have additional host service interfaces, each for coupling with an adapter.

In the embodiment illustrated, host service interfaces 14, 16 provide a mechanical power service, such as by having a power take-off with a keyed end for engagement with a complementary keyed power input shaft. Alternatively or additionally, either host service interface 14, 16 may provide electrical power service for electrically powering a functional device. Alternatively or additionally, either host service interfaces 14, 16 may provide a substance service, such as by having a fluid line coupling through which a fuel may be selectively provided to a functional device having a complementary fluid coupling and a fuel-powered mechanical service conversion device which consumes the fuel.

Each host service interface 14, 16 may include a host coupler 42 incorporating a service coupling feature and a recess 46 in a surface of the host 12 or in a component of the host service interface 14, 16. The host coupler 42 may be disposed in recess 46. When not used with an adapter 20, the host service interfaces 14, 16 may be covered and protected by an interface cover 50.

Host coupler 42 may be standardized so that it may be used by multiple adapters for coupling different types of functional devices to a variety of hosts. Host coupler 42 may comprise a socket or receptacle configured to accept a complementary plug associated with the adapter 20 that directly mates with the coupler or may be a contact point between the host service interface 14, 16 and the adapter 20 that are aligned by other features of the host mechanical power service interface and the adapter. It will be appreciated that the host coupler 42 may be chosen for the host service interface 14, 16 which incorporates any necessary seals, shields, shut offs and other features as are required for the type of mechanical power service or any other service being communicated by the host service interface 14, 16.

At least one mechanical support coupling device, such as screws 48, is associated with each host service interface 14, 16 to mechanically secure mechanical power service communicating device 18 to host 12 and to communicate a mechanical support service to adapter 20. The screws 48 are capable of engaging threaded holes 54 on either side of host coupler 42 and may be hidden in recess 46 by interface cover 50. The mechanical support service may alternatively be communicated by providing one or more anchor receivers in the recess 46 accepting anchors (not shown) extending from adapter 20. Mechanical support service provided to adapter 20 may also be at least partially communicated by host coupler 42. For example, if host coupler 42 is a mating receptacle and plug system, some mechanical support may be provided by the mechanical cooperation between the receptacle and the plug.

Figure 5:
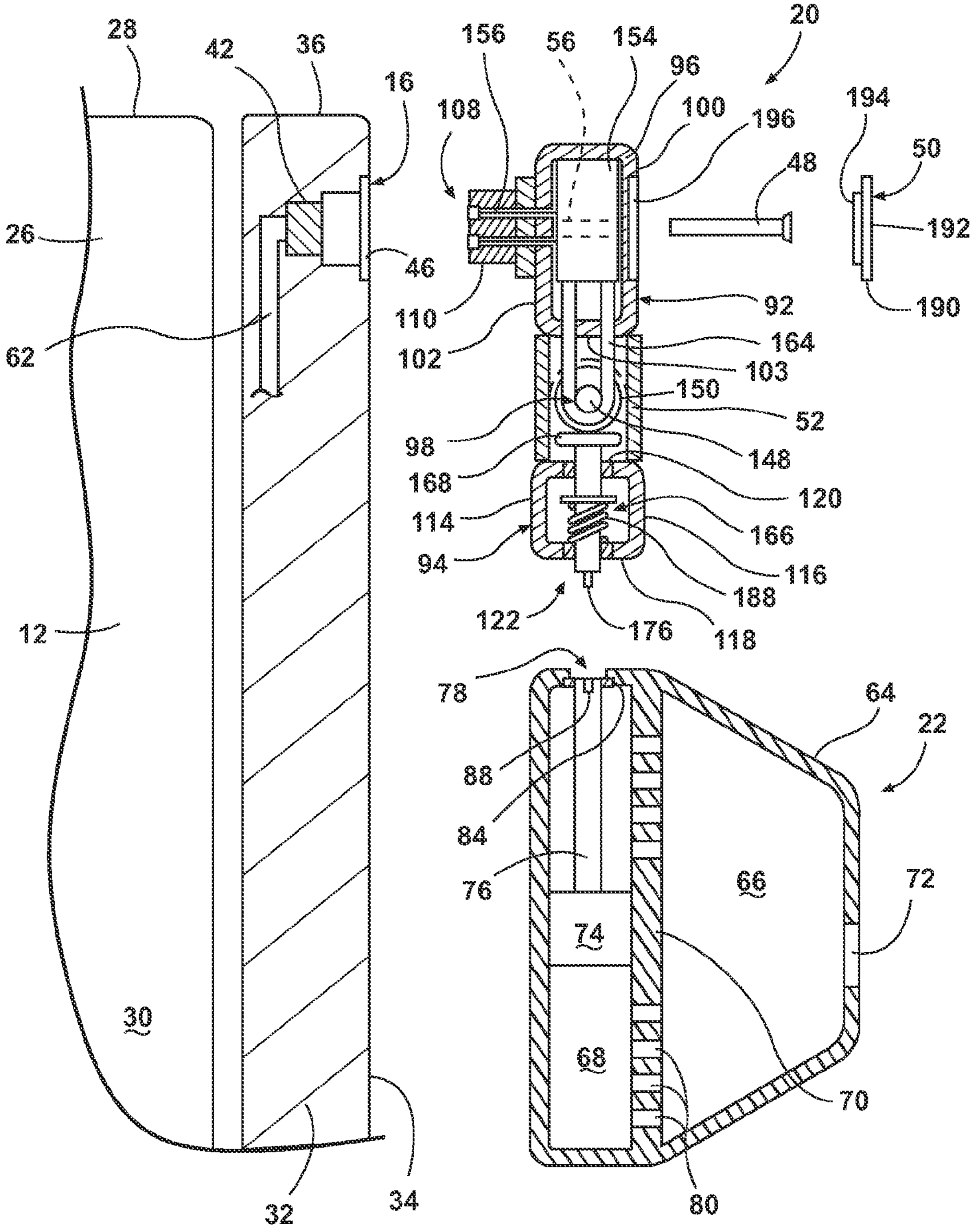
FIG. 5 is a an enlarged cutaway side view of the modular system of FIG. 1, showing the adapter in the second configuration.
Figure 6:
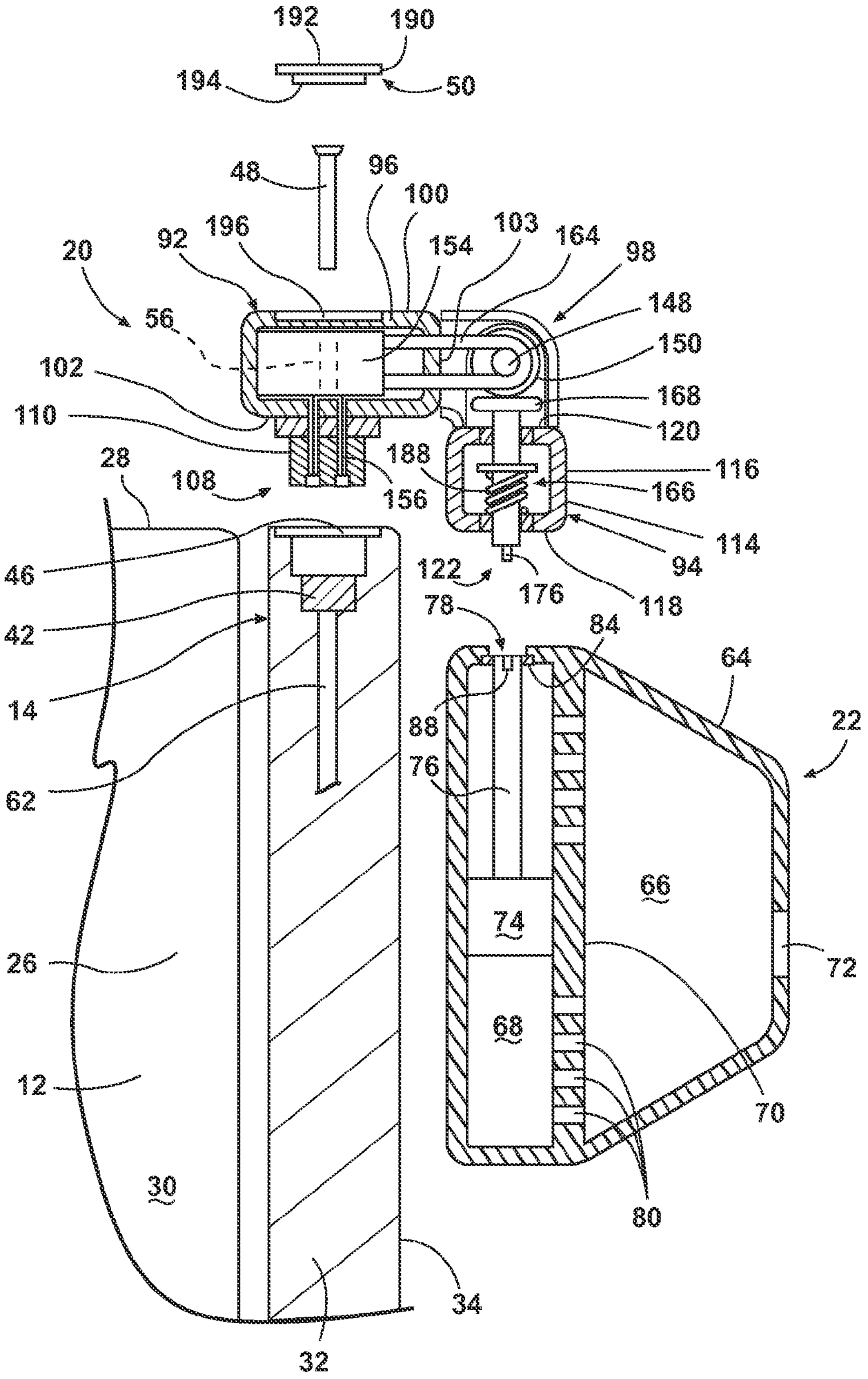
FIG. 6 is a an enlarged cutaway side view of the modular of FIG. 1, showing the adapter in the first configuration.

In addition to the mechanical support service provided to adapter 20, the host service interface 14, 16 communicates at least one service. More particularly, when coupled with an adapter 20, host service interface 14, 16 communicates the at least one service with the adapter 20, either providing or receiving the at least one service to or from adapter 20. Adapter 20 may in turn use the at least one service and/or communicate the at least one service with functional device 22.

Where host 12 is a functional apparatus, such as a refrigerator, using or generating a mechanical power communication service, it may communicate that service with the host service interface 14, 16. For example, an ice and water dispenser, not shown, of the refrigerator illustrated in FIG. 1 may use and provide water, and may also use a cooling service. Any of these services may be communicated by host 12 through host service interface 14, 16 so as to be available to be communicated with adapter 20. Alternatively, host service interface 14, 16 may obtain the at least one mechanical power communication service through host 12, but an additional service may be provided from a source independent of the host, such as a home water or other utility system. More generally, host service interface 14, 16 may provide and/or consume multiple services, as defined above. The service may be communicated between any combination of the host 12, adapter 20, and functional device 22. The additional service can be communicated to host coupler 42 by way of at least one service line 62 extending from host coupler 42 to a service provider or consumer system (not shown) within or external to the host 12 that provides or uses the service. As illustrated in FIGS. 5 and 6, service line 62 may extend through door 32. Adapter 20 may in turn consume the service or communicate the service with functional device 22, or convert the form of the service and communicate the converted service with functional device 22. The service may, for example, provide electrical power or data, mechanical power, or any fluid or gas. If the service is substance service, then service line 62 may be a supply line leading to a substance service consumer or provider in host 12. If the service is electrical service, then service lines 62 may be electrical power lines. If the service is mechanical power, the service lines 62 may include a rotating shaft, wheel or gear or a translating belt, chain or cable.

It is contemplated that there may be different categories of host service interfaces 14, 16 that may provide more than one service or more than one variation of a category of service or may have more than one coupler. Adapters may be used with such hosts, which may not take advantage of all of the substances or couplers available from the host service interface 14, 16 but communicate at least the mechanical support service and at least one mechanical power communication service with the host service interface 14, 16. For example, even if host service interface 14 were capable of communicating mechanical power, fluid, gas, electrical power, and data, an adapter 20 for use with this host service interface 14 may communicate only one or two of these services while another adapter 20 for use with the same host service interface 14 may communicate all of these services.

Referring to FIG. 1, functional device 22 can be selected for being removably coupled to host 12. Functional device 22 is a device that performs a primary function independent of host 12. In the embodiment illustrated, functional device 22 is a portable device where the primary function is storing, preserving and/or dispensing a substance. Alternatively, functional device 22 may perform some other electrical, chemical, mechanical, or data handling activity using a service communicated from adapter 20. Examples of functional devices 22 include a fan, an air treatment system, a heater, a cooling system, a can opener, a mixer, a blender, a video display, user interface, microprocessor, dispenser, a speaker, a data display, a keypad, a microphone, a camera, a fan or a power generation system. Functional device 22 may provide a user interface (not shown) to enable the user to interact with functional device 22, adapter 20 or host 12.

Referring to FIG. 5, functional device 22 is illustrated as a medicine module which may provide convenient access and consumer visibility to a supply of medicine for a consumer and allow environmental control for medicine and/or for the controlled dispensing of medicine. The medicine module may have a housing 64 having a medicine storage compartment 66 and a service compartment 68 separated by a wall 70. The medicine storage compartment 66 has an outlet 72 providing user access to the medicine, such as, but not limited to, a door, a dispensing chute, a dispensing wheel and a pill elevator. The service compartment 68 has a service consumer, such as a fan 74 connected by a service line, such as a shaft 76, to a first device service interface 78, described below, capable of communicating mechanical power to the fan 74 by way of shaft 76. Portions of wall 70 are provided with perforations 80 to permit the flow of air between service compartment 68 and medicine storage compartment 66.

It will be appreciated that alternative uses of mechanical power service by the medicine module include exchanging internal and external air, tumbling or mixing the medicine, mechanically dispensing the medicine, and operating a mechanical timer. It will further be appreciated that the medicine module is only one example of a functional device 22 that may be used.

Functional device 22 may use or provide additional services. When coupled to the host 12, functional device 22 may communicate a variety of services through first device service interface 78. It should be further noted that functional device 22 may be a service provider, a service consumer, or both. As illustrated, the functional device 22 is a mechanical power service consumer since it employs mechanical power from the first device service interface 78 to move the fan 74. As another example, functional device 22 may be a consumable holder capable of selectively providing a consumable substance to host 12 via adapter 20 or may receive a consumable from host 12 or adapter 20. Similarly, functional device 22 may have two-way data communication with adapter 20.

Figure 7A:
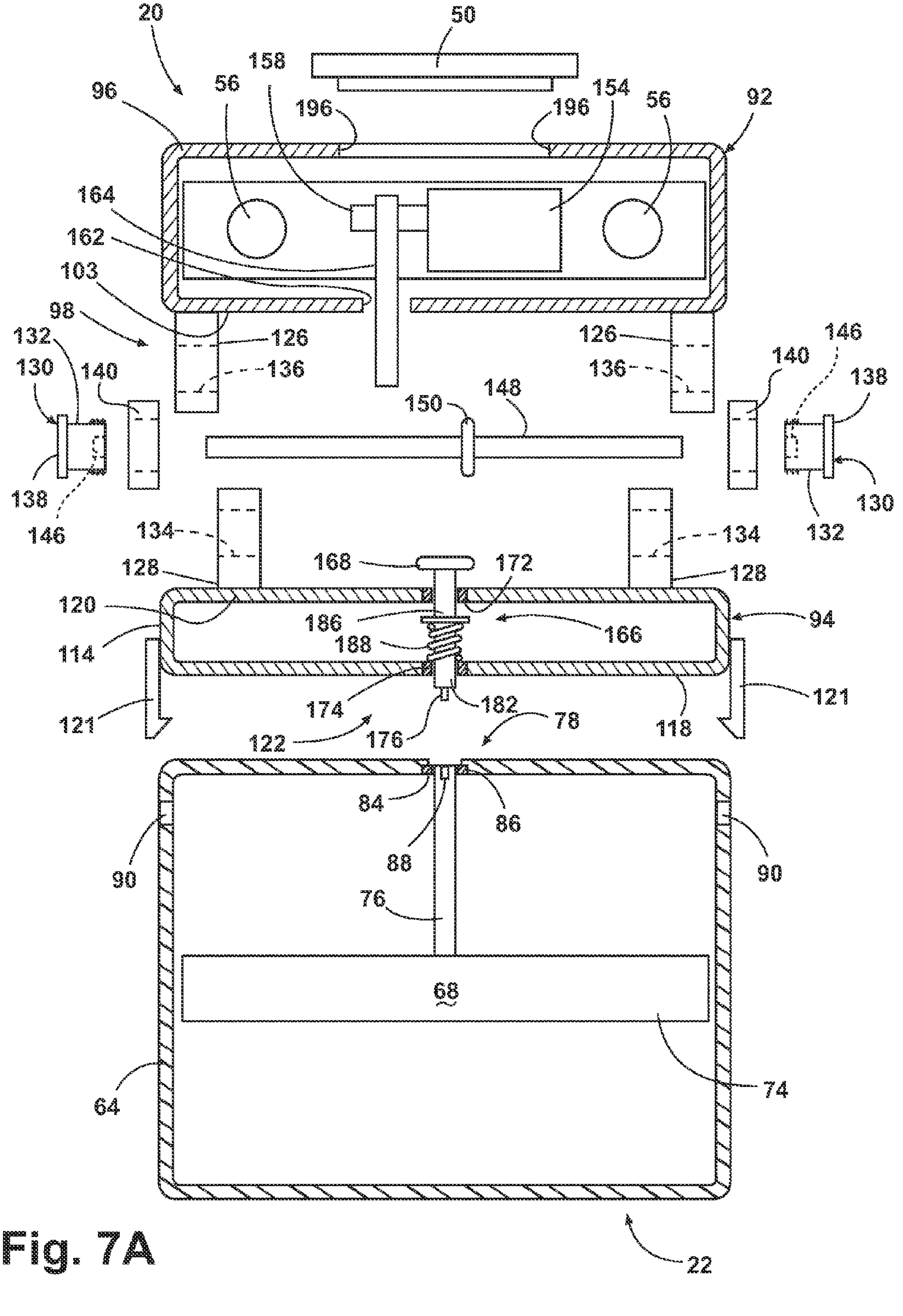
FIG. 7A is an exploded, partially schematic cutaway front view of the mechanical service communicating device of FIG. 1.
Figure 7B:
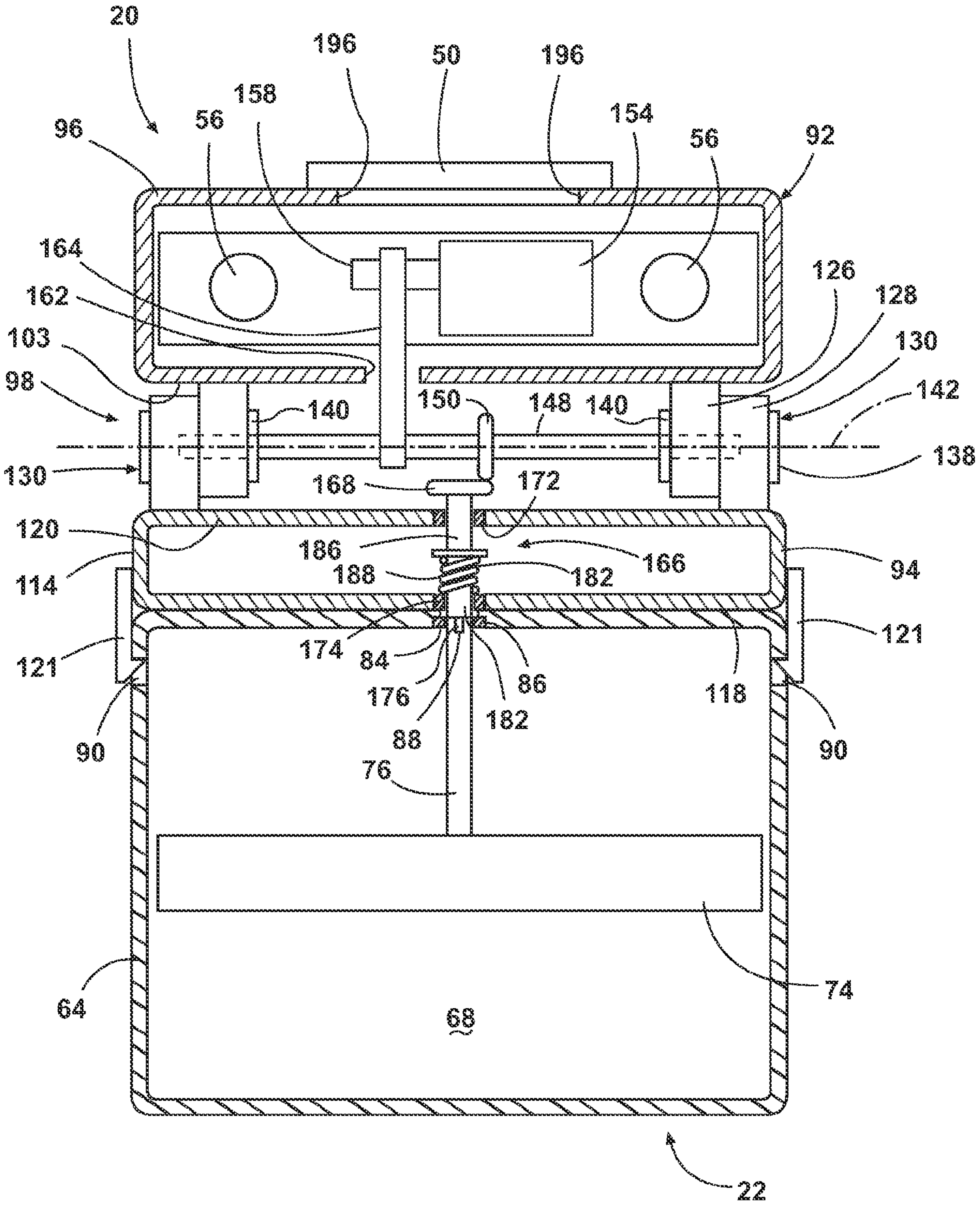
FIG. 7B is an assembled view of the mechanical service communicating device of FIG. 7A.

Referring to FIG. 7, as described above, first device service interface 78 communicates mechanical power service with the fan 74 through shaft 76. Shaft 76 extends from fan 74 through a bearing 84 fitted in an aperture 86 in housing 64. First device service interface 78 includes a keyed end 88 on shaft 76 capable of being drivingly engaged with a complementary keyed shaft or another services interface, described later herein. It will be appreciated that first device service interface 78, which communicates a mechanical power service, may be incompatible with host service interface 14, and therefore adapter 20 is required to couple functional device 22 to host 12.

It should be noted that alternative functional devices are contemplated having other types of device service interfaces for other types of services or having multiple device service interfaces. For example, a functional device requiring a substance service from host 12 or adapter 20 may use a fluid coupling as a first device service interface, a functional device requiring illumination or data may use a light pipe as a first device service interface, and a functional device requiring electrical power and data may use two or more electrical contacts as a first device service interface.

Functional device 22 may also be provided with one or more first mechanical support coupling elements 90, such as apertures, which are engageable by other mechanical support coupling elements for engaging complementary mechanical coupling components, described later. The mechanical support coupling device may be separate from first device service interface 78, as shown, or may be incorporated into first device service interface 78, not shown.

Referring to FIGS. 5-7, adapter 20 is provided to couple functional device 22 to host 12 since host service interface 14, 16 is not compatible with first device service interface 78. Adapter 20 has a first adapter component 92 and second adapter component 94 which are pivotally attached to each other by a hinge system 98, described later in detail. First adapter component 92 has a generally rectangular housing 96 having a front side 100, a back side 102, and a bottom side 103, with a host service interface 108 extending from backside 102 and capable of coupling with either host service interface 14 or 16 on host 20. With respect to the adapter 20, terms such as "front", "back", and "bottom" are used to describe the housing 96 with respect to the orientation of the adapter 20 shown in FIG. 5.

Host service interface 108 has an adapter coupler 110 insertable into recess 46 to couple with host coupler 42. For example, if host coupler 42 is a socket, adapter coupler 110 may be a plug capable of coupling with the socket. Alternatively, adapter coupler 110 and host coupler 42 may be provided with fittings that have no mechanical engagement function, and the couplers 42, 110 may be held in an aligned and coupled condition by cooperating mechanical coupling systems of host service interfaces 14 and 108, such as the screws 48. If screws 48 are used, first adapter component 92 can be provided with clearances or passageways 56 for screws 48. First adapter component 92 may have additional contacts and couplers for communicating additional services with the host 12. These may be associated with adapter coupler 110 or may be independent thereof Second adapter component 94 has a generally rectangular housing 114 having a front side 116, a bottom side 118, and a top side 120, with a second device service interface 122 extending from bottom side 118 and capable of coupling with first device service interface 78. Second adapter component 94 acts as a device holder for the functional device 22 in providing the mechanical support service to functional device 22, for example using second mechanical support coupling elements 121 (see FIG. 7), engageable with mechanical support coupling elements 90 of functional device 22. In the embodiment illustrated, first mechanical support coupling element 90 comprise apertures formed in housing 64 and second mechanical support coupling elements 121 comprise hooks attached to housing 114 and resiliently insertable into the apertures to removably secure functional device 22 to adapter 20. Second adapter component 94 also communicates an additional service with functional device 22 through second device service interface 122. For this purpose, second device service interface 122 is capable of coupling with first device service interface 78.

As with host service interfaces 14, 16 and 108, first and second device service interface 78 and 122 may have cooperating couplers, not shown, providing mechanical coupling of the components. Alternatively, adapter 20 and functional device 22 may have couplers provided with fittings that have no mechanical engagement function and the couplers are held in an aligned and coupled condition by cooperating mechanical coupling systems of first device service interface 78 and the second device service interface 122, such as by mechanical support coupling elements 90 and 121. Second adapter component 94 may also have additional contacts and couplers for communicating additional services with the host functional device 22. These may be associated with second device service interface 122 or may be independent thereof.

Details of the hinge system 98 between the first and second adapter components 92 and 94 will now be described. A best shown in FIG. 7, first adapter component 92 includes downwardly extending hinge supporting flanges 126 ending from bottom side 103 of housing 96. Similarly, second adapter component 94 has upwardly extending hinge supporting flanges 128 extending from the top side 120 of housing 114, each positioned adjacent one of the downwardly extending hinge supporting flanges 126. Two hinge pins 130 are provided, each having a head 138 and a shank 132 passed through apertures 134 and 136, respectively in one of the flanges 126 and 128. A fastener 140, such as a nut, is provided on the backside of each hinge pin 130 to secure the first and second adapter components 92 and 94 together. The pins 130 and fasteners 140 are designed and assembled to adapter components 92 and 94 in a manner to permit pivoting between adapter components 92 and 94. When assembled to the first and second adapter components 92 and 94, hinge pins 130 are axially aligned and provide a hinged connection therebetween along a pivot axis 142. Each hinge pin 130 further has a bore 146 accepting one end of a shaft 148 extending along hinge axis 142 between hinge pins 130. Hinge pins 130 act as bearings permitting the free rotation of shaft 148. A wheel or gear 150 is fixed to shaft 148 to rotate therewith.

It will be appreciated that, while pivoting of first and second adapter components 92 and 94 may be desirable for configuring adapter 20 for use with differently oriented host service interfaces 14 and 16, it may be desirable to inhibit such pivoting after adapter 20 is coupled with a host 12. This may be particularly true, for example, when host service interface is mounted to a movable component such as a door 32. For this purpose, fasteners 140 may act as a releasable locking system and may be selectively loosened to permit appropriate configuration of adapter 20 for use with a horizontal or vertical first host service interface, and then tightened to thereafter inhibit pivoting of the adapter components. For this purpose, fasteners 140 may be wing nuts to facilitate tool-free user operation. Alternatively, hinge system 98 may be provided with a separate releasable locking system (not shown) having respective interlocking components on the first and second adapter components 92 and 94 to releasably lock adapter components 92 and 94 in a desired configuration during use. It should be noted that, while adapter 20 is illustrated as locked for use in either of two orientations shown in FIGS. 5 and 6, it is contemplated that, for at least some applications, it may be desirable to have multiple operational orientations of varying angles between the first and second adapter components 92 and 94, depending upon the geometry of the host, the functionality of the adapter 20, the functionality of the functional device 22 and other considerations, such as ergonomics. It is further contemplated that preferred orientations may be facilitated, for example by detents or the like, not shown. Alternatively, no preferred orientations may be facilitated but instead continuous angular adjustment may be permitted to allow the user to finely adjust the angle between adapter components 92 and 94 to a desired orientation.

As shown in FIGS. 5-7, first adapter component 92 may further may have a service conversion device 154 within housing 96 connected by at least one service line 156 to host service interface 108. Service conversion device 154 converts the service communicated through host service interface 108 into a mechanical power service in the form of a rotating shaft 158. A mechanical power communication system 164 extends through an aperture 162 in housing 96 to transfer mechanical power between shaft 158 and shaft 148 and thereby permit the service conversion device 154 to drive wheel or gear 150. In the example illustrated, mechanical power communication system 164 is a belt wound about shafts 158 and 148 and designed to communicate mechanical power therebetween. Alternatively, for example, mechanical power communication system 164 may be cooperating gears or wheels, not shown.

The host service interface 108 illustrated in FIGS. 5-7 is an electrical power interface, service conversion device 154 is a motor, and service lines 156 are electrical lines. Alternatively or additionally, if host service interface 14, 16 provides mechanical power service, service line 156 may comprise a keyed shaft extending from host service interface 108 into housing 96 and service conversion device 154 may comprise gears, wheels or other mechanical power transmission devices. Alternatively or additionally, if host service interface 14, 16 communicates a substance such as a fuel, host service interface 108 may comprise a fluid coupling, service line 156 may comprise a conduit extending from second host service interface 108 into housing 96 and service conversion device 154 may comprise a fuel-powered engine.

It will be appreciated that service conversion device 154 may have appropriate switches, control devices, and/or user interfaces (not shown) for regulating its operation, including components within the housing 96 and/or outside of housing

96. If host service interface 108 communicates a data service, the control devices may receive data from host 12 that affects the control of service conversion device 154 or may transmit data to host 12 or about the operation of the service conversion device.

As shown in FIG. 7, second adapter component 94 has a shaft system 166 having a wheel or gear 168 engaging wheel or gear 150 for communication of mechanical power therebetween. Shaft system 166 extends through aligned apertures 172 and 174 through top side 120 and bottom side 118 of housing 114. Shaft system 166 is provided with a keyed end 176 forming a part of second device service interface 122 for engagement with first device service interface 78. Suitable bearings may be provided in apertures 172 and 174 to permit the free rotation of shaft system 166.

Shaft system 166 may be a single shaft or may be, as shown, a first shaft 182, having a keyed end 176, and having an opposite end partially nested in and keyed to rotate with a second shaft 186 having wheel or gear 168. A biasing member 188, such as a spring, is provided between housing 114 and second shaft 186 to bias wheel or gear 168 into engagement with wheel or gear 150.

First shaft 182 and keyed end 176 of the shaft system form the second device service interface 122, which is a mechanical power service interface. Alternatively or additionally, if second device service interface 122 communicates a service type other than mechanical power service, first shaft 182 and keyed end 176 may be replaced by an appropriate service conversion device, service line, and service interface type (not shown), similar to those described above with reference to first adapter component 92.

In operation, host service interface 108 of adapter 20 is coupled to either host service interface 14 or 16 of host 12, and second device service interface 122 is coupled to first device service interface 78 of functional device 22. A service, such as electrical power, is communicated through the host service interfaces 14 or 16 and 108 to service conversion device 154, which sequentially communicates mechanical power to shaft 158, belt 164, wheel or gear 150, wheel or gear 168, and shaft system 166. Shaft system 166, in turn, communicates mechanical power to functional device 22 which uses the rotation movement transmitted to shaft 76 by shaft to rotate the fan 74.

It will be appreciated that, by aligning shaft 148 with pivot axis 142 of first and second adapter component 92 and 94, the mechanical components may remain engaged for transferring mechanical power between the first and second adapter component 92 and 94 regardless of the orientation of the first adapter component 92 relative to the second adapter component 94 for engagement with a horizontally disposed host service interface 14 as shown in FIG. 6 or a vertically disposed host service interface 16 as shown in FIG. 5. It will also be appreciated that it is desirable to provide a hinge cover 52 (see FIGS. 1, 2 and 3) over shaft 148 and gear or wheel 150. Hinge cover 52 may be a tambour door, or a series of nested panels that extend or contract as the adapter components 92 and 94 are pivoted relative to each other. The hinge cover 52 may be guided by the flanges 126 and 128 to avoid interference with the wheel or gear 150.

It will further be appreciated that adapter 20 may have added functionality, other than that illustrated herein. For example the adapter 20 can have user interface that may be used to communicate with host 12 or functional device 22 when the adapter 20 is coupled to the host 12 or the functional device 22, respectively. As another example, the adapter 20 may include a system for storing substance received from host 12 and later providing the stored substance to functional device 22. In implementations where adapter 20 has additional functionality, adapter 20 may communicate some services with just first host service interface 14 or functional device 22 without communicating the same service between first host service interface 14 and functional device 22.

Figure 2:
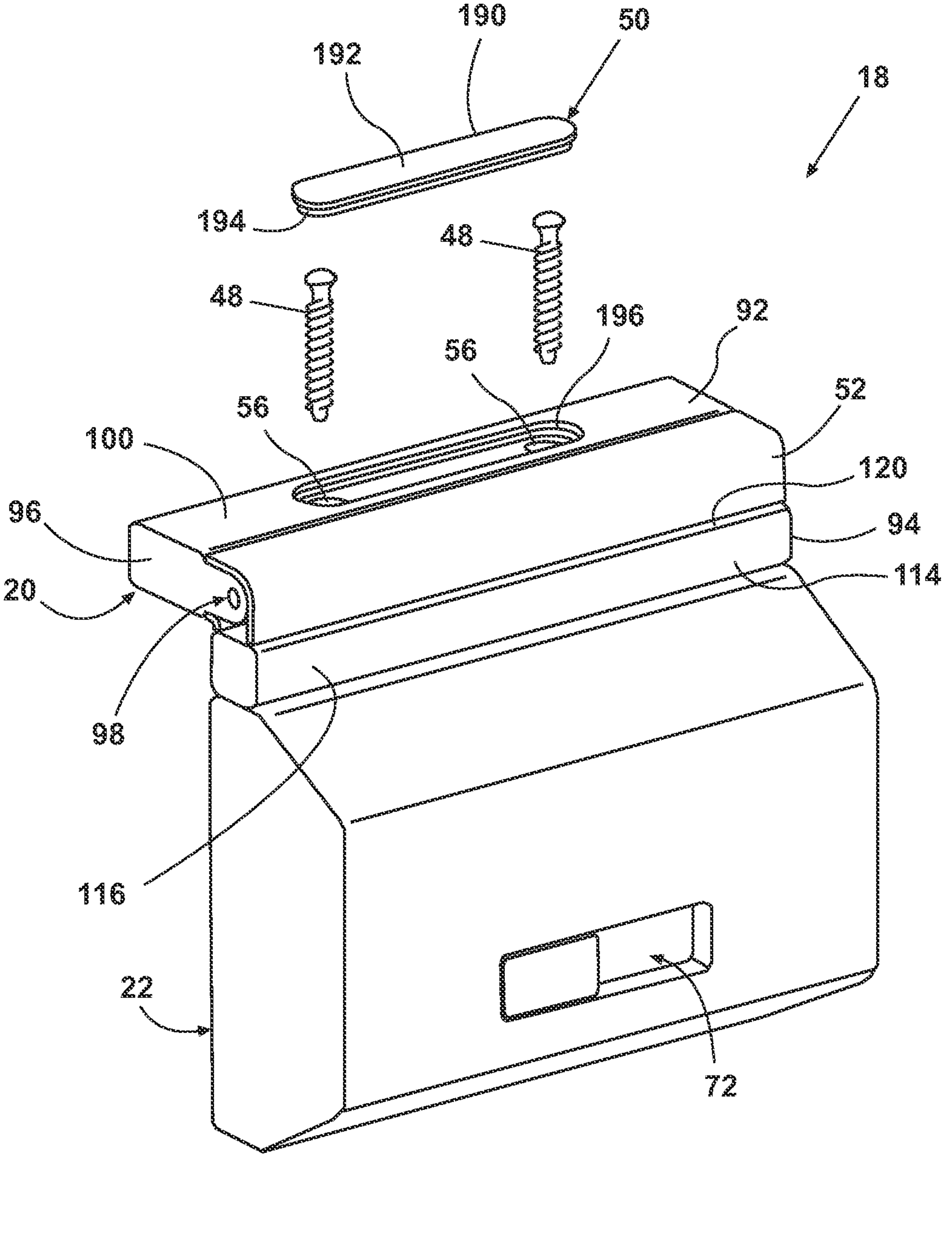
FIG. 2 is a perspective view of the mechanical service communicating device of FIG. 1 in a first configuration for connection to a host service interface on a horizontal surface.
Figure 3:
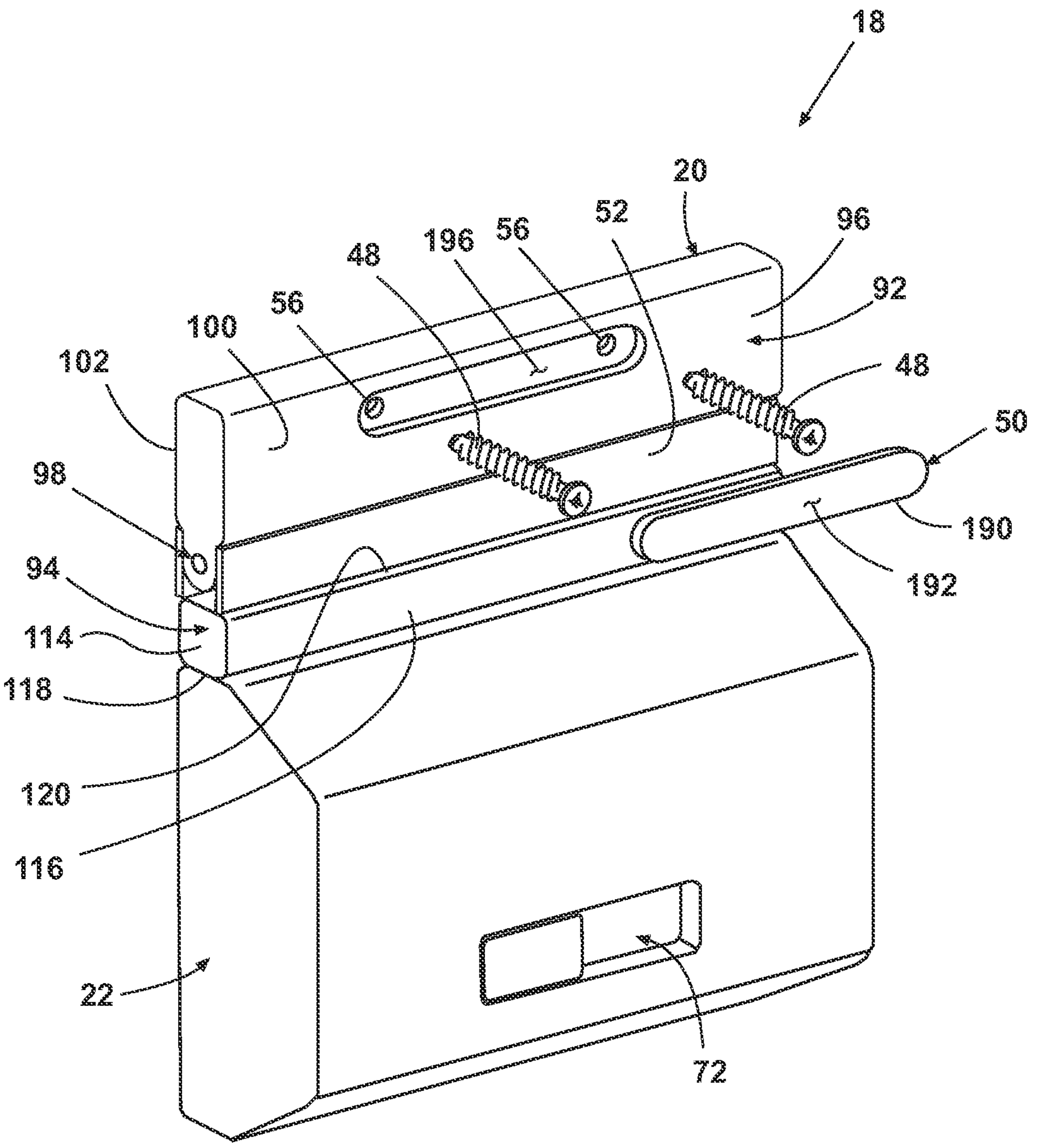
FIG. 3 is a perspective view of mechanical service communicating device of FIG. 1 in a second configuration for connection to a host service interface on a vertical surface.

It will be appreciated that adapter 20 may be designed so as to be generally flush with one or more surfaces of host 12. Thus, when used with a host 12 having a host service interface 14 oriented horizontally on a vertical surface, as illustrated in FIGS. 2 and 6, adapter 20 may be configured such that both adapter components 92 and 94 are disposed along a common vertical plane and are flush with the vertical surface, such as the vertical front face 34 of the door 32. When used with a host 12 having a host service interface 14 oriented vertically on a horizontal surface that is adjacent a vertical surface, as shown in FIGS. 3 and 5, adapter 20 may be configured such that the adapter components 92 and 94 oriented such that first adapter component 92 is flush with the horizontal surface, such as the horizontal top edge 36 of the door 32, and second adapter component 94 is with flush with the vertical surface, such as the vertical front face 34 of the door 32. For example, second adapter component 94 may be pivoted approximately ninety degrees from the first adapter component 92. Similarly, both components 92 and 94 of adapter 20 may be mounted flush with a horizontal surface or components 92 and 94 may be configured to be oriented at other relative angles, as required by the nature of various hosts. It may further be desirable to releasably secure adapter components 92 and 94 of adapter 20 into one or more of these relative orientations to prevent undesirable swinging of adapter 20, particularly if the adapter is to be mounted to a moving host, such as a vehicle, or to a moving component of a host, such as a door.

Adapter 20 may further comprise an additional functionality unrelated to the supplying of service between host 12 and functional device 22. Adapter 20 may have a functionality that may operate independently of host 12 or functional device 22, or it may enhance one or more of the functions of host 12 or functional device 22. The functionality may be dependent upon whether adapter 20 is coupled with host 12, and also on whether functional device 22 is coupled with adapter 20. The functionality may permit adapter 20 and/or functional device 22 to be used independently of host 12. Examples of adapter functionality, not shown, include, but are not limited to, a speaker, a user interface, a display projection, a media manager, a whiteboard, physical storage, application software hosting, communications routing, power storage, microphone, and data storage. An adapter 20 with physical storage functionality may comprise a storage compartment, not shown, for storing items, and may be particularity useful for storing companion items for functional device 22, such as a spoon or other measuring or metering device. An adapter 20 may also have power storage functionality such as a rechargeable battery, for powering functional device 22.

As best shown in FIGS. 1-3, modular system 10 may include detachable interface cover 50. Detachable interface cover 50 provides host 12 with a finished appearance by covering any unused components of the host service interfaces 14, 16, such as host coupler 42, and further protects the host service interfaces 14, 16 from unintentional access or damage. Interface cover 50 is provided with a flange-like face portion 190 having an ornamental surface 192 and mounting system such as a mounting flange 194 insertable into the same recess 46 in the surface of host 12 that alternatively accommodates the host service interface 14, 16. Alternatively, other coupling or fastening systems may be used to attach interface cover 50 to host 12 or first host service interface 14 or 16. Interface cover 50 may fill an aesthetic function, by being made to conform to the color and contour of host 12, such as by matching the finish of door 32, or cabinet 26 or other features and trim of the host 12. Alternatively, interface cover 50 may contrast with the finish of host 12.

To prevent interface cover 50 from being misplaced or lost when adapter 20 and functional device 22 are coupled to host service interface 14, 16, interface cover 50 may alternatively be attached to adapter 20 when adapter 20 is attached to host service interface 14, 16. A recess 196 may be provided on front side 100 of first adapter component 92, opposite the host service interface 108, to receive the mounting flange 194 of the interface cover 50. In this position, the interface cover 50 also service to protect or hide screws 48. Alternatively, interface cover 50 may be used to cover an additional host mechanical power service interface provided on adapter 20 for the sequential or ganged mounting of additional adapters 20 (not shown).

Figure 8:
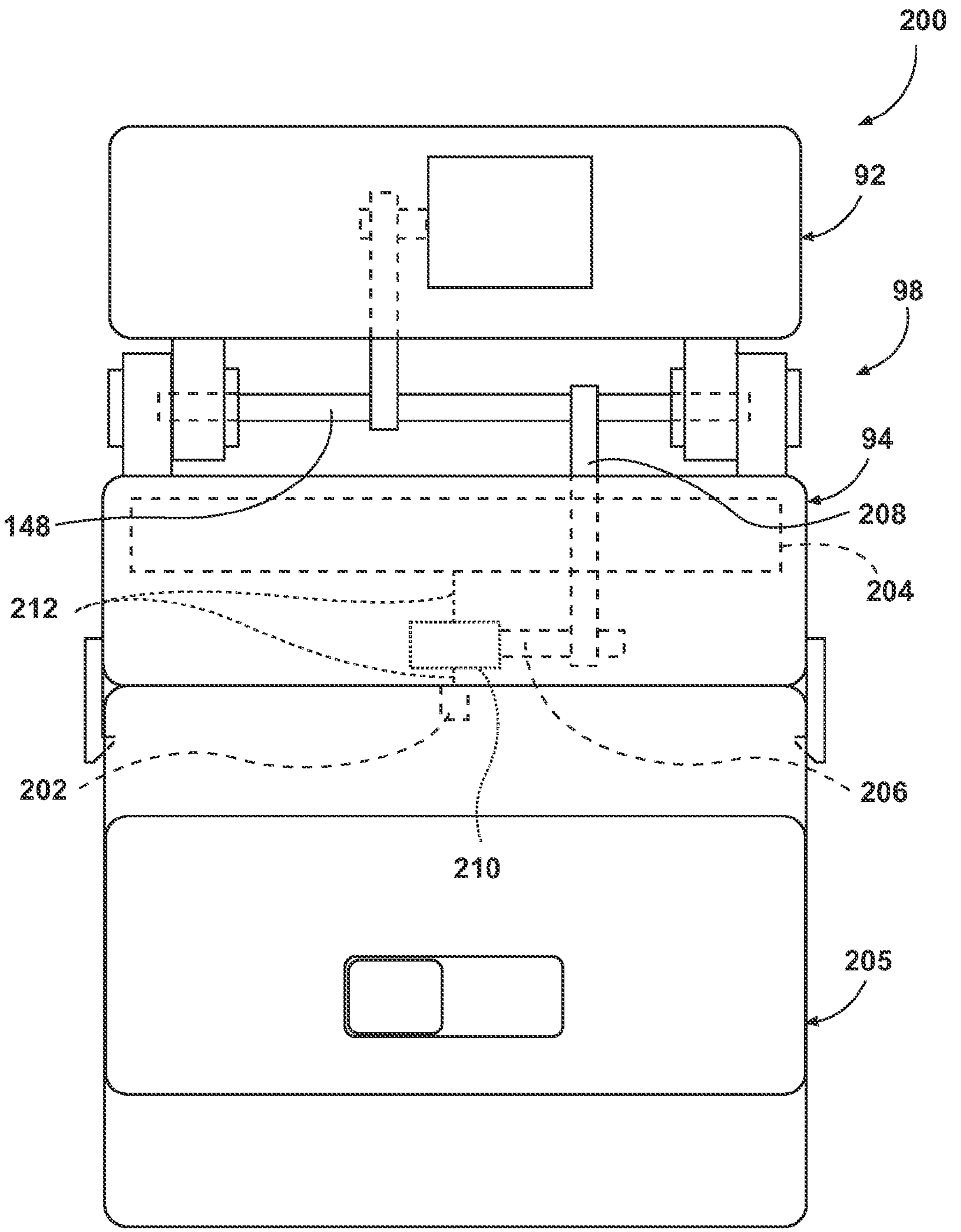
FIG. 8 is a partially schematic front view of a mechanical service communicating device according to a second embodiment of the invention

FIG. 8 illustrates a second embodiment of a mechanical service communicating device having an adapter 200 that is similar to adapter 20 described above for FIGS. 1-7, except that instead of providing a mechanical power service, a second device service interface 202 provides a substance service, such as dispensing an additive stored in a substance supply compartment 204, to a functional device 205 that uses the additive. Shaft 148 is rotatably driven in the manner described above for the adapter 20. In this example, however, a shaft 206 receives mechanical service power from shaft 148 by use of a belt or cable 208. Shaft 206 drives a dispensing device 210, shown only schematically, to selectively dispense an additive from substance supply compartment 204 along a service line 212 to second device service interface 202. Dispensing device 210 may, for example, be a rotating member with a dispensing aperture, not shown.

Figure 9:
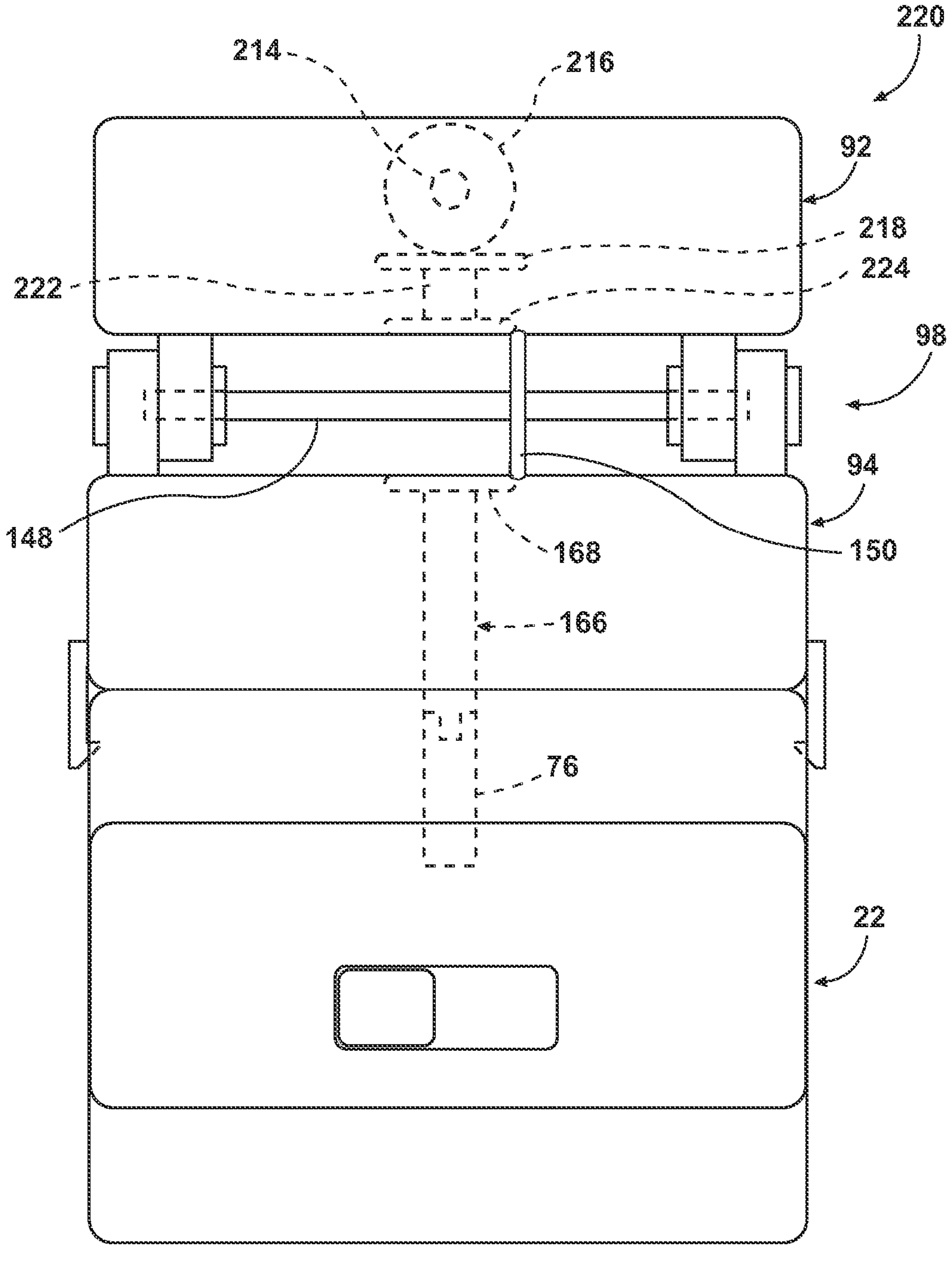
FIG. 9 is a partially schematic front view of a mechanical service communicating device according to a third embodiment of the invention.
Figure 10:
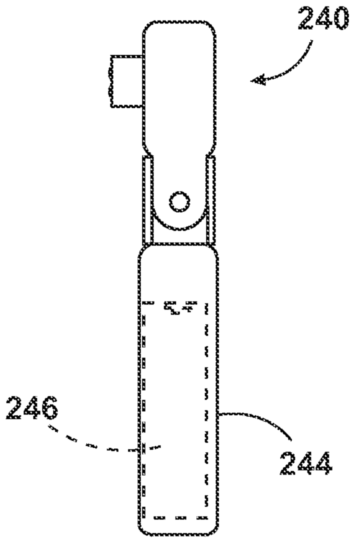
FIGS. 10 and 11 are side views, with portions shown in phantom line, of a mechanical service communicating device according to a fourth embodiment of the invention having an adapter shown respectively in a first configuration and a second configuration.
Figure 11:
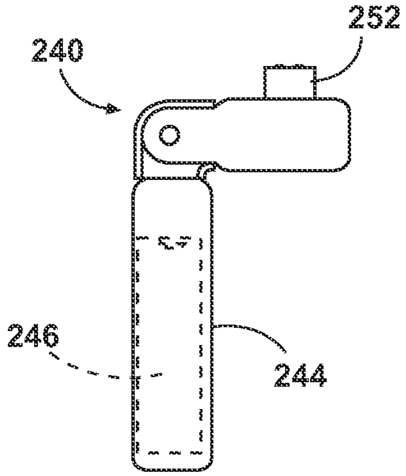

FIG. 9 illustrates a third embodiment of a mechanical service communicating device having an adapter 220 that is similar to adapter 20 described above for FIGS. 1-7, except that a host interface 214 of the adapter 220 receives mechanical power service directly from a host, such as host 12, and uses the mechanical power service to rotate a first wheel or gear 216 to rotate a second gear or wheel 218 on one end of a shaft 222. A third gear or wheel 224 at the other end of shaft 222 engages and drives wheel or gear 150 on shaft 148. The other components of adapter 220 are similar to the components described above for adapter 20.

Figure 12:
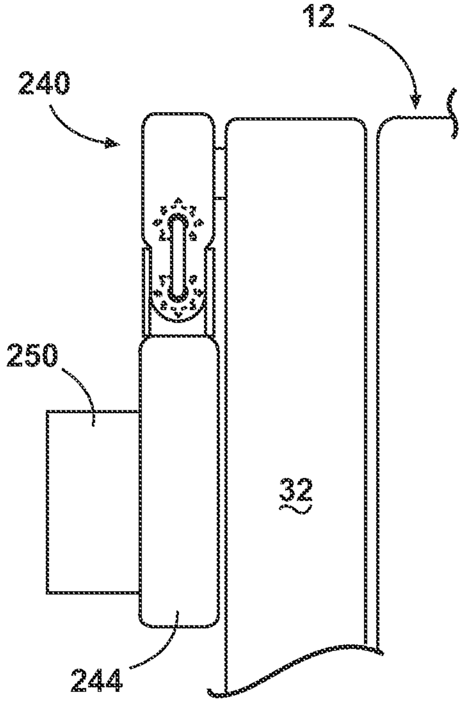
FIGS. 12 and 13 are side views, with portions shown in phantom line, of the adapter of FIGS. 10 and 11 coupled to a functional device and to alternative hosts.
Figure 13:
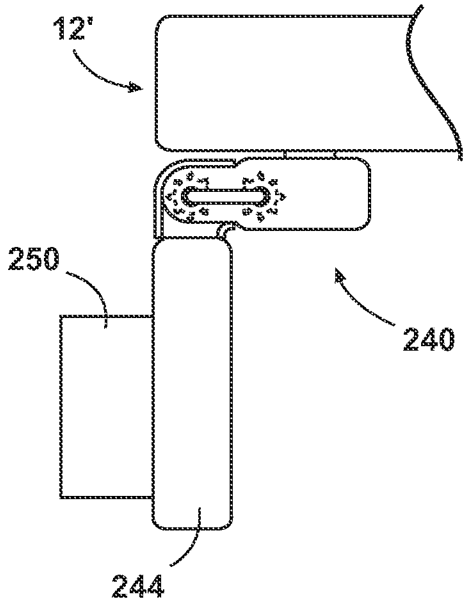

FIGS. 10 through 13 illustrate a fourth embodiment of a mechanical service communicating device having an adapter 240 that is similar to adapter 20 described above for FIGS. 1-7, except that second adapter component 244 has a cradle 246 (see FIGS. 10 and 11) for at least partially holding a functional device 250 (see FIGS. 12 and 13). FIG. 13 further illustrates a host 12' having a host interface, not shown, having downward facing horizontal surface for engagement with an upwardly oriented host service interface 252, (see FIG. 11). For example, host 12' may be a kitchen cabinet or a device mounted to the underside of a kitchen cabinet. It is further contemplated that adapter 240 may be used in configurations of less than or greater than ninety degree angles.

Figure 14:
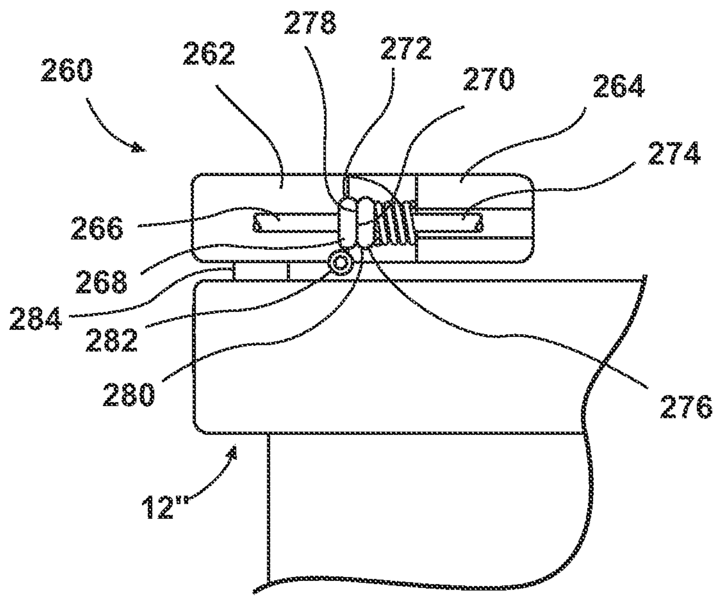
FIGS. 14 and 15 are schematic side views of a modular system according to according to a fifth embodiment of the invention comprising a functional device and a host, with the functional device shown respectively in a first and a second configuration.
Figure 15:
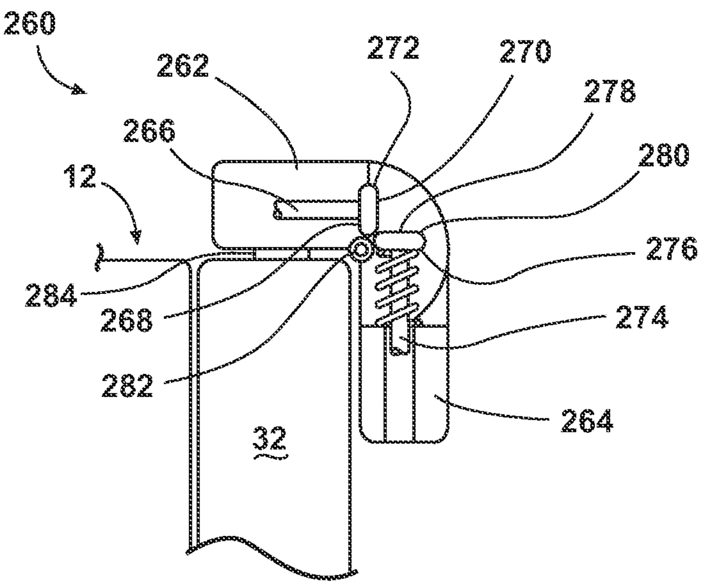

FIGS. 14 and 15 illustrate a fifth embodiment of a modular system comprising an adapter 260 that is similar to adapter 20 described above for FIGS. 1-7, except that there is no shaft along the hinge axis of adapter 260. Instead, mechanical power is transmitted between first and second adapter components 262 and 264 at the pivot axis by means of wheels or gears engaging different surfaces depending on the relative orientations of the first and second adapter component 262 and 264. More particularly, one of the adapter components, in this case first adapter component 262, is provided with a shaft 266 coupled to a wheel or gear 268 having a flat clutch face 270 and a clutch edge 272, either of which is capable of communicating mechanical power. The other adapter component, in this case second adapter component 264, is provided with a spring loaded shaft 274 coupled to a wheel or gear 276 also having a flat clutch face 278 and a clutch edge 280, either of which is capable of communicating mechanical power. First and second adapter components 262 and 264 are pivotally interconnected, for example by pivot pin 282, which defines the pivot axis, so as to pivot between a first position, shown in FIG. 14, wherein the clutch faces 270 and 278 are interengaged, and a second position, shown in FIG. 15, wherein clutch edges 272 and 280 are interengaged. Spring loaded shaft 274 translates resiliently as the components are relatively pivoted between the first and second position to maintain driving contact between gear or wheels 268 and 276.

FIG. 14 further illustrates a host 12" having a host service interface (not shown) positioned on an upwardly facing horizontal surface for engagement with a downwardly oriented host service interface 284 on the adapter 240. For example, host 12" may be a kitchen counter, the top of a refrigerator, or a device mounted to a horizontal surface.

Figure 16:
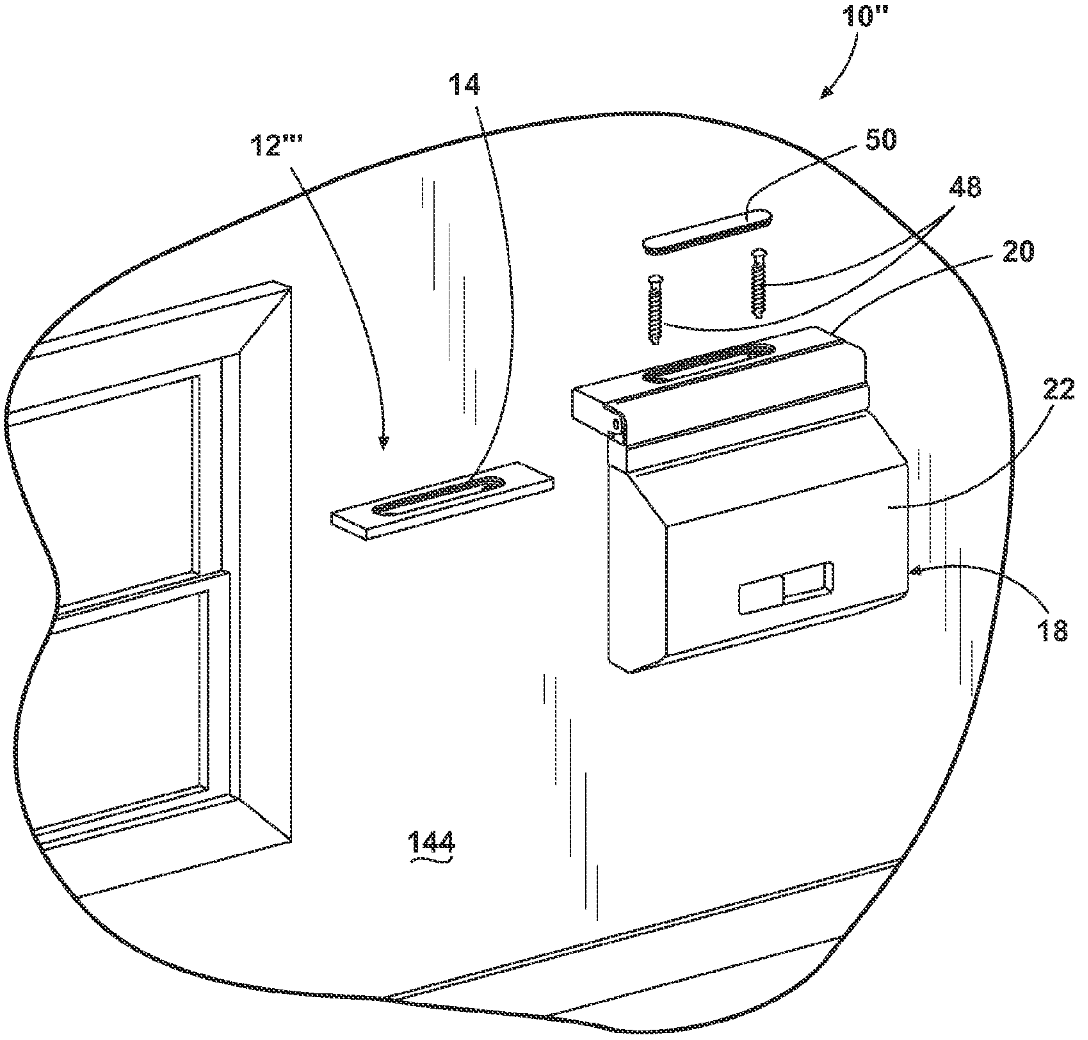
FIG. 16 is an exploded perspective view of a modular system according to a sixth embodiment of the invention comprising a wall-mounted host and a mechanical service communicating device.

Referring to FIG. 16, a modular system 10" according to a sixth embodiment of the invention is shown. As described above, host service interface 14 or 16 may be associated with a host other than an appliance. As illustrated in FIG. 16, an exemplary wall host 12'" may be mounted to a wall 144. While illustrated schematically as projecting from wall 144 and providing an upwardly oriented host service interface 14, host service interface 14 of the wall host 12'" may alternatively be oriented in any desired direction. Wall host 12'" may be integrated with wall 144 to provide a flush mounting with wall 144 or may be a modular unit that may be removably mounted to wall 144. Wall host 12'" may have its own internal supplier or consumer of the service or may receive the service from the environment such as by being coupled to a residential electric or water supply. The same mechanical connectors, such as screws 48, could be located on either side of the coupler to couple mechanical power communicating device 18 to wall host 12'".

Figure 17:
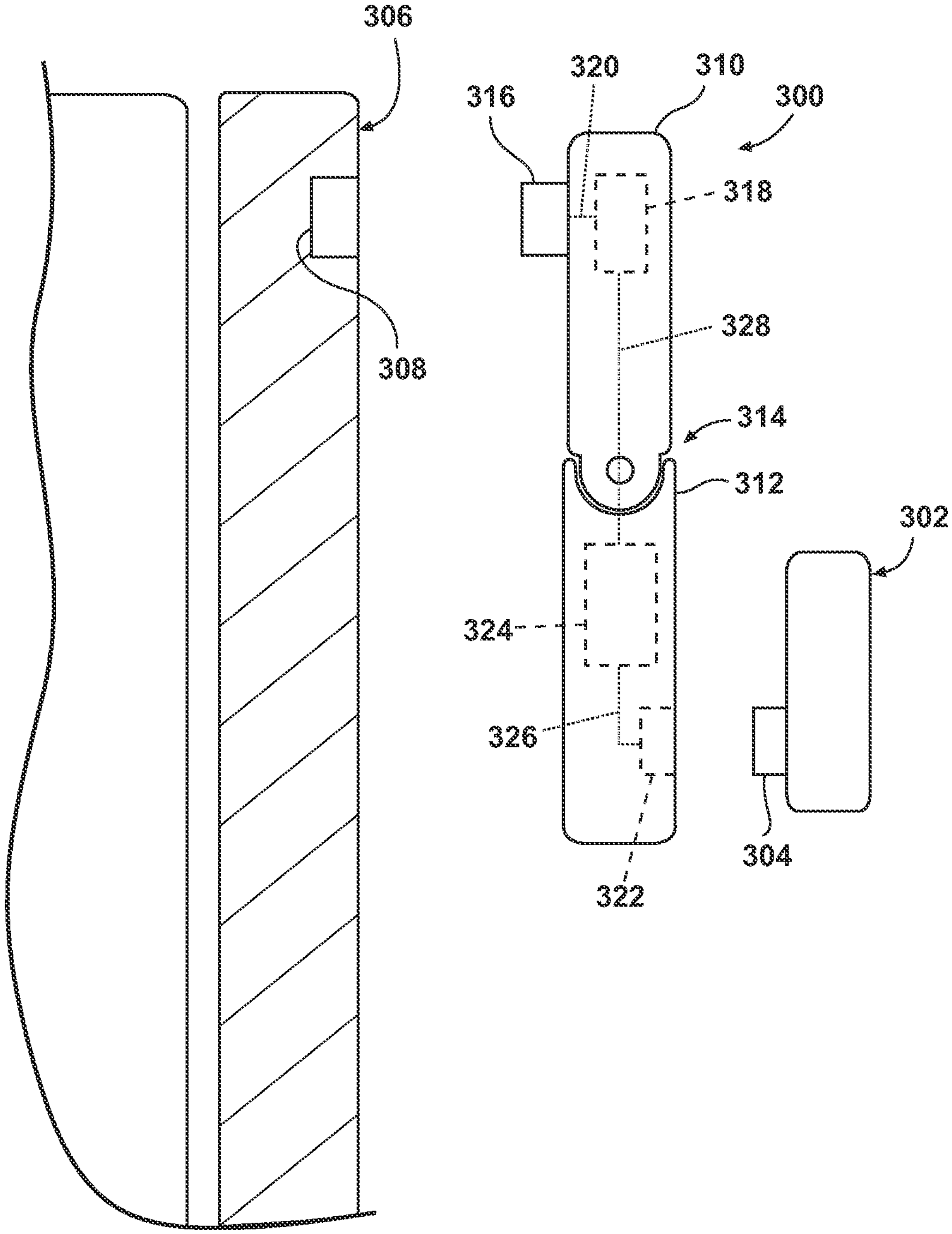
FIG. 17 is a partially schematic front view of a mechanical service communicating device according to a seventh embodiment of the invention.

FIG. 17 is a schematic view of a seventh embodiment of a modular system having a mechanical power communicating device 300 for mounting a functional device 302 having a device service interface 304 to a host 306 having a host service interface 308. The mechanical power communicating device 300 comprises a first component 310 movably connected to a second component 312 by a hinge system 314. The mechanical power communicating device 300 provides for at least two service conversions.

The first component 310 includes a first service interface 316 capable of removably coupling with the host service interface 308 and communicating a first service with the host service interface 308 and a first service conversion device 318 converting the first service to a first mechanical power service. The first service conversion device 318 may be in communication with the first service interface 318 via a service pathway 320 to receive the first service from the first service interface 318. Examples of mechanical power service conversion devices are given above. The first service interface 316 may be compatible with other hosts in addition to host 306. For example, the first service interface 316 could couple with the host service interface 14 or 16 of host 12, as shown in FIG. 1

The second component 312 includes a second service interface 322 capable of coupling with the device service interface 304 and communicating a second service with the device service interface 304, and a second service conversion device 324 converting the first mechanical power service to the second service. The second service conversion device 324 may be in communication with the second service interface 322 via a service pathway 326 to provide the second service from the second service interface 322.

The hinge system 314 is substantially identical to the hinge system 98, described above for FIGS. 1-9, and therefore will not be described in detail for this embodiment. The hinge system 314 pivotally connects the first component 310 to the second component 312 to pivotally support the second component 312 in a plurality of relative angular orientations about a pivot axis defined by a shaft 148, which carries a wheel or gear 150 as previously disclosed.

A service pathway 328 communicates the first mechanical power service between the first and second components 310, 312 in at least two relative angular positions of the first and second components 310, 312. The service pathway 328 can be integrated with the hinge system 314, or be separately formed. If separately formed, the service pathway 328 can pass through or around the hinge system 314.

The first and second services can be the same service, or different services. Each of the first and second services can comprise at least one of a mechanical power service, a data service, an electromagnetic power service, a substance service, a thermal energy service, an acoustical service, and an illumination service. At least one of the first and second services can comprise a mechanical power service.

Figure 18:
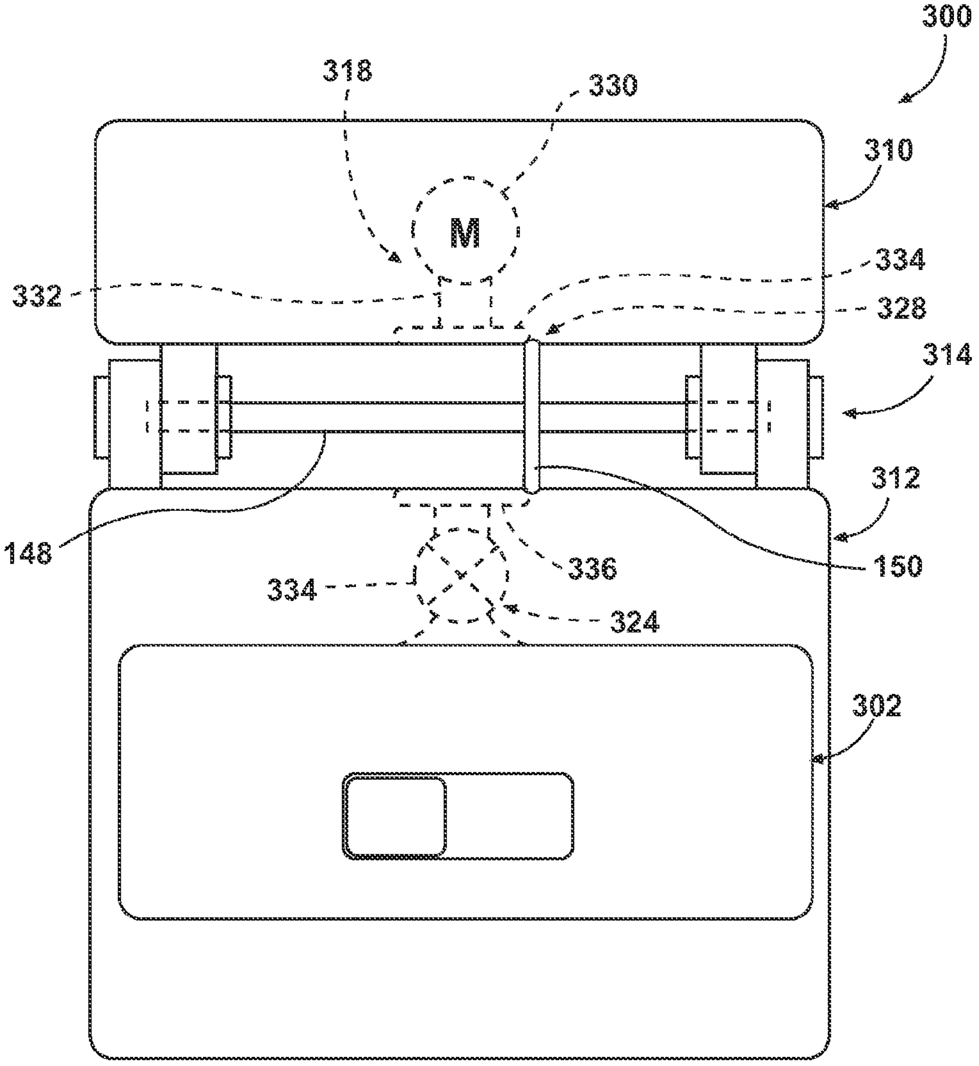
FIG. 18 illustrates one example of the device of FIG. 17 in greater detail.

FIG. 18 illustrates one example of the mechanical power communicating device 300 in greater detail. As illustrated, the mechanical power communicating device 300 is an adapter, and the second service interface 322 is capable of removably coupling with the device service interface 304 of the functional device 302. However, the mechanical power communicating device 300 can alternately comprise a functional unit along with the functional device. The first conversion device 318 is illustrated as a motor 330 having a rotatable shaft 332 and the second conversion device 324 is illustrated as a pump 334. The host 306 can supply electrical service to the motor 330 via the coupled host service interface 308 and the first service interface 316. The motor 330 uses the electrical service to rotate the shaft 332, resulting in the conversion of the electrical service to a mechanical power service; specifically, to shaft power. The rotation of the shaft 332 is communicated to the second component 312 by the service pathway 328. As illustrated, the service pathway 328 is integrated with the hinge system 314, and comprises a first wheel or gear 334 on the end of the shaft 332, the wheel or gear 150 on the shaft of the hinge system 314, and a second wheel or gear 336 coupled to the pump 334. The first wheel or gear 334 is rotated by the shaft 332, and engages and drives the wheel or gear 150. In turn, the wheel or gear 150 engages and drives the second wheel or gear 336. The second wheel or gear 336 in turn operates the pump 334, resulting in the conversion of shaft power to fluid power. The fluid power is communicated to the functional device 302 via the coupled second service interface 322 and device service interface 304. For example, the fluid power can be used by functional device 302 such as a vacuum packager, a food aerator, or a food dispenser.

Figure 19:
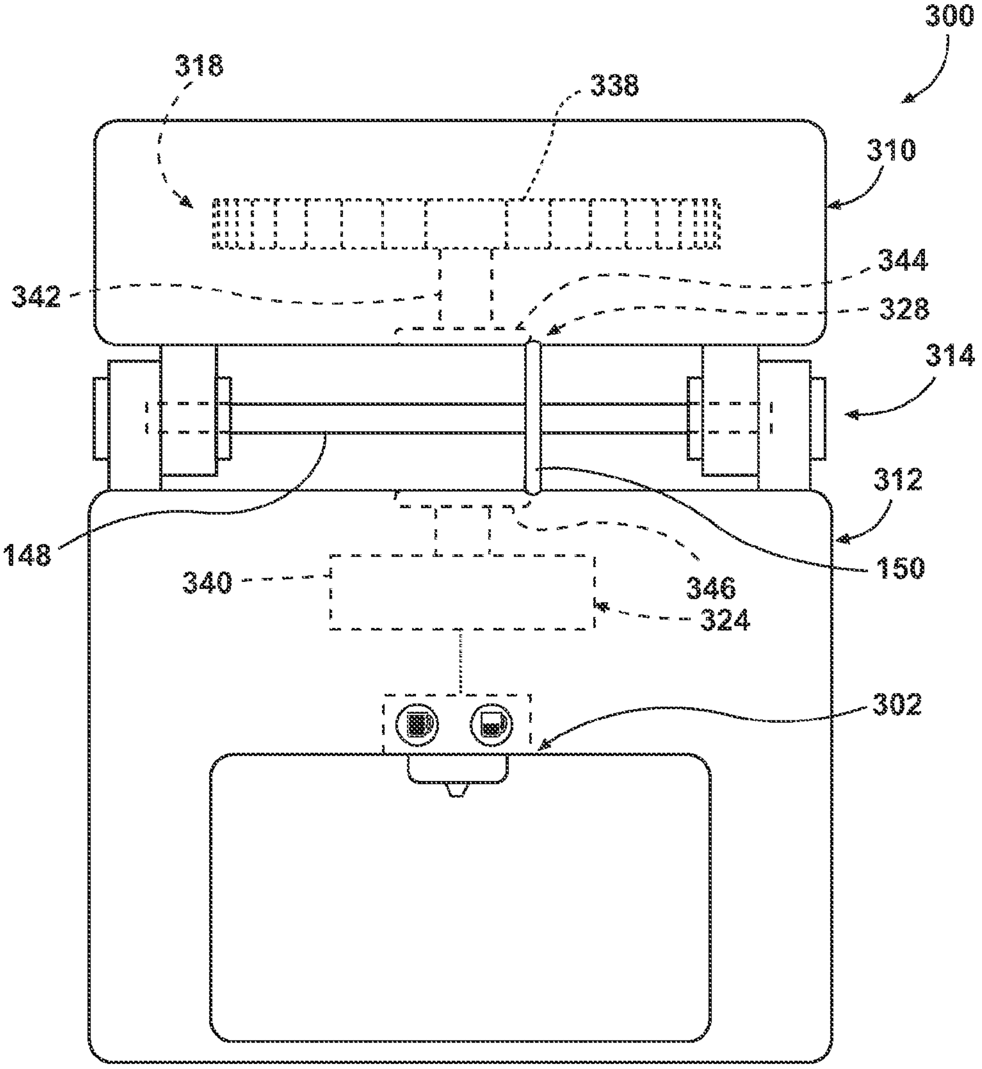
FIG. 19 illustrates another example of the device of FIG. 17 in greater detail.

FIG. 19 illustrates another example of the mechanical power communication device 300. The first conversion device 318 is illustrated as a turbine 338 and the second conversion device 324 is illustrated as an electricity generator 340. The host 306 can supply moving air to the turbine 338 via the coupled host service interface 308 and the first service interface 316. The turbine 338 is coupled to a shaft 342 which rotates with the turbine 338, resulting in the conversion of the one mechanical power service to another; specifically, fluid power to shaft power. The rotation of the shaft 342 is communicated to the second component 312 by the service pathway 328. As illustrated, the service pathway 328 is integrated with the hinge system 314, and comprises a first wheel or gear 344 on the end of the shaft 342, the wheel or gear 150 on the shaft of the hinge system 314, and a second wheel or gear 346 coupled to the electricity generator 340. The first wheel or gear 344 is rotated by the shaft 342, and engages and drives the wheel or gear 150. In turn, the wheel or gear 150 engages and drives the second wheel or gear 346. The second wheel or gear 346 in turn operates the electricity generator, resulting in the conversion of mechanical service to electrical service. The electrical service is communicated to the functional device 302 via the coupled second service interface 322 and device service interface 304. For example, the electrical service can be used by functional device 302 such as a coffee maker.

Although each of the modular systems disclosed herein is described as having a single host, a single mechanical power service communicating device, a single adapter, and/or a single functional device, various additional combinations of these components can also be considered to be modular systems.

With regard to the processes, systems, methods, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

It is to be understood that the above description is intended to be illustrative and not restrictive. Many embodiments and applications other than the examples provided would be apparent to those of skill in the art upon reading the above description. The scope of the invention should be determined, not with reference to the above description, but should instead be determined with reference to the appended claims, along with the full scope of equivalents to which such claims are entitled. It is anticipated and intended that future developments will occur in the arts discussed herein, and that the disclosed systems and methods will be incorporated into such future embodiments. In summary, it should be understood that the invention is capable of modification and variation and is limited only by the following claims.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A system for communicating a mechanical power service, comprising:

a household appliance having an electrical output coupler providing electrical power; and a mechanical power communicating device mountable to the household appliance and comprising:

a first component comprising:

an electrical input coupler capable of removably coupling with the electrical output coupler and receiving electrical power from the household appliance; and a motor electrically coupled to the electrical input coupler and having a drive shaft, the motor converting the electrical power from the household appliance to a mechanical power service comprising mechanical power or movement via rotation of the drive shaft;

a second component comprising a mechanical power consumer that uses the mechanical power service and having a mechanical power input coupler supplying the mechanical power service to the mechanical power consumer;

a hinge pivotally connecting the first component to the second component for movement about a pivot axis and comprising a hinge shaft defining the pivot axis; and a transmission comprising:

a transfer element provided on the hinge shaft and operably coupled to the mechanical power input coupler of the mechanical power consumer to supply the mechanical power service from the first component to the second component via rotation of the transfer element; and a drive element coupled between the drive shaft and one of the hinge shaft or the transfer element for converting rotation of the drive shaft into rotation of the one of the hinge shaft or the transfer element;

wherein the transfer element remains operably coupled to the drive shaft and the mechanical power input coupler during movement of the first component relative to the second component about the pivot axis.

2. The system according to claim 1 wherein the drive element comprises at least one of a belt, a gear, a wheel, a chain, or a cable.

3. The system according to claim 1 wherein:

the transfer element comprises a first wheel provided on the hinge shaft, the first wheel having a first engagement surface capable of communicating the mechanical power service; and the transmission further comprises a second wheel disposed adjacent the pivot axis, the second wheel having a second engagement surface engageable with the first engagement surface and being capable of communicating the mechanical power service with the first engagement surface.

4. The system according to claim 3 wherein the first and second engagement surfaces comprise at least one of a clutch surface or a gear surface.

5. The system according to claim 3 wherein the first and second wheels rotate about perpendicular axes when the first and second engagement surfaces are engaged.

6. The system according to claim 3, and further comprising a biasing member biasing at least one of the first and second wheels into engagement with the other of the first and second wheels.

7. The system according to claim 1, and further comprising a locking system to selectively lock the first and second components in at least one relative angular orientation.

8. The system according to claim 1 wherein the first component comprises a service consumer.

9. The system according to claim 1 wherein the second component is pivotally connected to the first component to pivot between a first orientation wherein the electrical input coupler is generally oriented in a parallel plane with the mechanical power input coupler, and a second orientation wherein the electrical input coupler is generally oriented in a plane perpendicular to the plane in which the mechanical power input coupler is oriented.

10. The system according to claim 9 wherein the electrical input coupler and the mechanical power input coupler face opposing directions relative to the pivot axis in the first orientation.

11. The system according to claim 1 wherein the second component pivots relative to the first component between a first orientation having a first angular relationship between the first and second components, and a second orientation having a second angular relationship between the first and second components different than the first angular relationship, and wherein the mechanical power service is supplied between the first and second components in both the first and second orientations.

12. The system according to claim 1, wherein the transfer element comprises a rotatable member coupled to the hinge shaft.

13. The system according to claim 12, wherein the hinge comprises:

a pair of first apertures formed in the first component;

a pair of second apertures formed in the second component, with each second aperture adjacent to one of the first apertures to form an adjacent set of first and second apertures that is aligned with the pivot axis;

a pair of hinge pins, each inserted into at least one of the adjacent sets of first and second apertures; and a bore in each of the hinge pins, each bore being axially aligned with the pivot axis;

wherein the hinge shaft comprises two ends, with each end inserted into one of the bores; and wherein the rotatable member is mounted to the hinge shaft at a location between the hinge pins.

14. The system according to claim 13 wherein each hinge pin comprises a shank having a first and a second end, a head formed at a first end of the shank, and a threaded portion at the second end, and the hinge further comprises two fasteners that are threadably engaged with one of the threaded portions to secure the hinge pins to the first and second components.

15. The system according to claim 14, wherein the fasteners are selectively tightenable to inhibit the relative movement of the first and second components about the pivot axis.

16. The system according to claim 12, wherein the drive element comprises a belt coupling the drive shaft with the rotatable member.

17. The system according to claim 1, wherein the electrical output coupler comprises one of a vertical orientation and a horizontal orientation, and the second component is pivotally connected to the first component to move between at least a first position for connecting to the electrical output coupler having the vertical orientation, and a second position for connecting to the electrical output coupler having the horizontal orientation.

18. The system according to claim 17 wherein the household appliance comprises a door with a peripheral edge, and the electrical output coupler has a horizontal orientation and is provided on the peripheral edge.

19. The system according to claim 17, wherein the household appliance comprises a door with a vertical face, the electrical output coupler has a vertical orientation and is provided on the vertical face.

20. The system according to claim 17 wherein in the first position the first and second components are oriented along a common plane and in the second position the first and second components are oriented along perpendicular planes.

21. The system according to claim 1, and further comprising a removable cover selectively connected to the household appliance to cover the electrical output coupler when the mechanical power communicating device is not mounted to the household appliance, and selectively connected to the mechanical power communicating device when the mechanical power communicating device is mounted to the household appliance.

22. The system according to claim 21 wherein the removable cover is connected to the first component opposite the electrical input coupler when the removable cover is connected to the mechanical power communicating device.

23. The system according to claim 1 wherein the mechanical power consumer comprises at least one of a dispenser or a fan.

24. The system according to claim 1 wherein the mechanical power service is rotational shaft power.

25. The system according to claim 1 wherein the household appliance comprises a refrigerator.

26. The system according to claim 1, wherein the transfer element comprises one of a gear or a wheel mounted to the hinge shaft.

27. The system according to claim 26, wherein the second component comprises one of a gear or a wheel that engages the one of a gear or a wheel mounted to the hinge shaft.

28. The system according to claim 1, wherein the drive element comprises a belt coupling the drive shaft to the hinge shaft.

29. The system according to claim 1, wherein the hinge comprises:

a pair of first apertures formed in the first component;

a pair of second apertures formed in the second component, with each second aperture adjacent to one of the first apertures to form an adjacent set of first and second apertures that is aligned with the pivot axis; and a pair of hinge pins, each inserted into at least one of the adjacent sets of first and second apertures.

30. The system according to claim 1, wherein the second component further comprises an adapter component pivotally connected to the first component by the hinge and a functional device coupled with the adapter component, wherein the mechanical power consumer is positioned within the functional device.

31. The system according to claim 30, wherein the functional device comprises the mechanical power input coupler.

32. The system according to claim 31, wherein the transmission comprises a first shaft operably coupled between the transfer element and mechanical power output coupler.

33. The system according to claim 32, wherein the mechanical power consumer comprises a second shaft connected to the mechanical power input coupler.

34. The system according to claim 33, wherein the first and second shafts comprise keyed ends which are capable of engagement with each other.

* * * * *